US008980539B2

(12) United States Patent
Furukawa et al.

(10) Patent No.: US 8,980,539 B2
(45) Date of Patent: Mar. 17, 2015

(54) DEVELOPER

(71) Applicant: JSR Corporation, Tokyo (JP)

(72) Inventors: Taiichi Furukawa, Tokyo (JP); Hirokazu Sakakibara, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 14/190,594

(22) Filed: Feb. 26, 2014

(65) Prior Publication Data

US 2014/0178825 A1 Jun. 26, 2014

Related U.S. Application Data

(62) Division of application No. 13/177,487, filed on Jul. 6, 2011, now Pat. No. 8,703,401.

(30) Foreign Application Priority Data

Jun. 1, 2011 (JP) .................. 2011-123697

(51) Int. Cl.
*G03F 7/32* (2006.01)
*G03F 7/004* (2006.01)
*G03F 7/039* (2006.01)
*G03F 7/20* (2006.01)

(52) U.S. Cl.
CPC ................ *G03F 7/325* (2013.01); *G03F 7/327* (2013.01); *G03F 7/0046* (2013.01); *G03F 7/0397* (2013.01); *G03F 7/2041* (2013.01)
USPC .......... 430/331; 430/322; 430/270.1

(58) Field of Classification Search
CPC ....... G03F 7/40; G03F 7/0035; G03F 7/0392; G03F 7/38; G03F 7/168; G03F 7/0382; G03F 7/2024; G03F 7/32; G03F 7/004; G03F 7/20; G03F 7/327; H01L 21/0273; H01L 21/0337; H01L 21/31144; H01L 21/0274; H01L 21/32139; H01L 21/0275
USPC ................. 430/322, 331
See application file for complete search history.

(56) References Cited

U.S. PATENT DOCUMENTS

| 3,704,257 | A | 11/1972 | Mod et al. |
| 5,250,375 | A | 10/1993 | Sebald et al. |
| 2003/0064327 | A1 | 4/2003 | Rottstegge |
| 2010/0075257 | A1 | 3/2010 | Takemoto et al. |
| 2010/0323305 | A1 | 12/2010 | Tsubaki et al. |
| 2011/0159253 | A1 | 6/2011 | Kang et al. |

FOREIGN PATENT DOCUMENTS

| JP | 53-120430 A | 10/1978 |
| JP | 55-134847 A | 10/1980 |
| JP | 06-12452 B | 5/1984 |
| JP | 59-93448 | 5/1984 |
| JP | 63-116151 A | 5/1988 |
| JP | 03-194559 | 8/1991 |
| JP | 05-188598 | 7/1993 |
| JP | 10-123725 A | 5/1998 |
| JP | 2000-199953 | 7/2000 |
| JP | 2000-310861 A | 11/2000 |
| JP | 2002-003715 A | 1/2002 |
| JP | 2005-352384 | 12/2005 |
| JP | 2011-033841 A | 2/2011 |
| TW | 201111908 A | 4/2011 |
| WO | WO 2007/116664 | 10/2007 |
| WO | WO 2010/140709 | 12/2010 |

OTHER PUBLICATIONS

Japanese Office Action for corresponding JP Application No. 2011-150480, Feb. 28, 2012.
A. W. Ralston et al., "Solubilities of High Weight Normal Aliphatic Primary Amines", The Journal of Organic Chemistry, vol. 9, No. 1, Jan. 1, 1944, pp. 102-112, XP55039329, See Cite No. 17.
Extended European Search Report for corresponding EP Application No. 12161159.4-2222, Oct. 9, 2012.
Office Action issued in Jan. 6, 2015, in Japanese Patent Application No. 2012-101143 filed Apr. 26, 2012 (w/ English-language Translation).
Search Report issued Oct. 28, 2014, in Taiwan Patent Application No. 101104359 filed Feb. 10, 2012 (with English translation).

*Primary Examiner* — Caleen Sullivan
(74) *Attorney, Agent, or Firm* — Oblon, McClelland, Maier & Neustadt, L.L.P.

(57) ABSTRACT

A developer includes an organic solvent and a nitrogen-containing compound. The developer is configured to develop a resist film to form a negative resist pattern. The resist film is formed using a photoresist composition. The photoresist composition includes a polymer and a radiation-sensitive acid generator. The polymer includes a structural unit including an acid-labile group.

9 Claims, No Drawings

DEVELOPER

CROSS-REFERENCE TO RELATED APPLICATIONS

The present application is a divisional application of the U.S. patent application Ser. No. 13/177,487, filed Jul. 6, 2011, which claims priority under 35 U.S.C. §119 to Japanese Patent Application No. 2011-123697, filed Jun. 1, 2011. The contents of these applications are incorporated herein by reference in their entirety.

BACKGROUND OF THE INVENTION

1. Field of the Invention

The invention relates to a developer.

2. Discussion of the Background

A reduction in the line width of a resist pattern used for lithography has been desired along with miniaturization of the structure of electronic devices (e.g., semiconductor devices and liquid crystal devices). A fine resist pattern having a line width of about 90 nm can be formed using an ArF excimer laser. However, it will be required to form a finer resist pattern in the future.

As technology that improves the resolution of a chemically-amplified photoresist composition using an existing system without increasing the number of steps, an organic solvent having a polarity lower than that of an alkaline aqueous solution may be used as the developer (see Japanese Patent Application Publication (KOKAI) No. 2000-199953).

Specifically, when forming a resist pattern using an alkaline aqueous solution as the developer, it is difficult to form a fine resist pattern due to poor optical contrast. When forming a resist pattern using an organic solvent as the developer, however, a fine resist pattern can be formed due to an increase in optical contrast.

SUMMARY OF THE INVENTION

According to one aspect of the present invention, a developer includes an organic solvent and a nitrogen-containing compound. The developer is configured to develop a resist film to form a negative resist pattern. The resist film is formed using a photoresist composition. The photoresist composition includes a polymer and a radiation-sensitive acid generator. The polymer includes a structural unit including an acid-labile group.

DESCRIPTION OF THE EMBODIMENTS

According to one embodiment of the invention, a pattern-forming method includes:

(1) a step of forming a resist film on a substrate using a photoresist composition;
(2) a step of exposing the resist film; and
(3) a step of developing the exposed resist film using a negative developer that includes an organic solvent, the photoresist composition including (A) a polymer that includes a structural unit (I) including an acid-labile group that dissociates due to an acid, the solubility of the polymer in the developer decreasing upon dissociation of the acid-labile group (hereinafter may be referred to as "polymer (A)"), and (B) a photoacid generator (hereinafter may be referred to as "acid generator (B)"), and the developer including a nitrogen-containing compound.

According to the pattern-forming method, since the negative developer that includes the organic solvent includes the nitrogen-containing compound, a film loss in the exposed area can be suppressed. Moreover, since the dissolution contrast between the unexposed area and the exposed area during the development step is improved, a pattern that exhibits reduced LWR, and exhibits sufficient lithography characteristics (e.g., EL and DOF) can be formed. Note that the term "acid-labile group" used herein refers to a group that substitutes a hydrogen atom of a polar group (e.g., carboxyl group, hydroxyl group, amino group, or sulfo group), and dissociates due to an acid.

The nitrogen-containing compound is preferably a compound shown by the following formula (1).

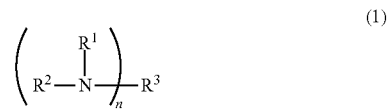

wherein $R^1$ and $R^2$ individually represent a hydrogen atom, a hydroxyl group, a formyl group, an alkoxy group, an alkoxycarbonyl group, a chain-like hydrocarbon group having 1 to 30 carbon atoms, an alicyclic hydrocarbon group having 3 to 30 carbon atoms, an aromatic hydrocarbon group having 6 to 14 carbon atoms, or a group formed by two or more of these groups, $R^3$ represents a hydrogen atom, a hydroxyl group, a formyl group, an alkoxy group, an alkoxycarbonyl group, an n-valent chain-like hydrocarbon group having 1 to 30 carbon atoms, an n-valent alicyclic hydrocarbon group having 3 to 30 carbon atoms, an n-valent aromatic hydrocarbon group having 6 to 14 carbon atoms, or an n-valent group formed by two or more of these groups, n is an integer equal to or larger than 1, provided that a plurality of $R^1$ and a plurality of $R^2$ may respectively be either the same or different when n is 2 or more, and two of $R^1$ to $R^3$ may bond to form a cyclic structure together with the nitrogen atom bonded thereto.

If the nitrogen-containing compound has the above specific structure, a film loss in the exposed area can be further suppressed. Moreover, a pattern formed by the pattern-forming method exhibits reduced LWR and sufficient EL, DOF, and the like.

The structural unit (I) is preferably a structural unit that includes a group shown by the following formula (2).

wherein $R^p$ represents an acid-labile group.

If the structural unit (I) includes a group shown by the formula (2), the acid-labile group dissociates due to an acid generated in the exposed area of the resist film used for the pattern-forming method, so that a carboxyl group having high polarity is produced. The carboxyl group interacts with the nitrogen-containing compound included in the developer, so that the solubility in the developer can be further reduced. Therefore, a film loss in the exposed area can be further suppressed. Moreover, a pattern formed by the pattern-forming method exhibits reduced LWR and sufficient EL, DOF, and the like.

The structural unit (I) is preferably a structural unit shown by the following formula (3).

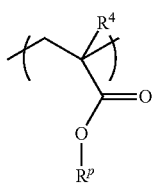

(3)

wherein R⁴ represents a hydrogen atom, a methyl group, or a trifluoromethyl group, and R^p is the same as defined for the formula (2).

If the structural unit (I) has the above specific structure, the acid-labile group dissociates due to an acid generated in the exposed area, so that a carboxyl group is produced. The carboxyl group interacts with the nitrogen-containing compound included in the developer, so that the solubility in the developer can be further reduced. Therefore, a film loss in the exposed area can be further suppressed by the pattern-forming method. Moreover, a pattern formed by the pattern-forming method exhibits reduced LWR and sufficient EL, DOF, and the like.

The acid-labile group represented by R^p is preferably a group shown by the following formula (4).

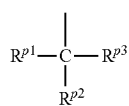

(4)

wherein $R^{p1}$ to $R^{p3}$ represent an alkyl group having 1 to 4 carbon atoms or an alicyclic hydrocarbon group having 4 to 20 carbon atoms, provided that some or all of the hydrogen atoms of the alkyl group or the alicyclic hydrocarbon group may be substituted with a substituent, and $R^{p2}$ and $R^{p3}$ may bond to form a divalent alicyclic hydrocarbon group having 4 to 20 carbon atoms together with the carbon atom bonded thereto.

If the acid-labile group represented by R^p in the formulas (2) and (3) is a group having the specific structure shown by the formula (4), the acid-labile group easily dissociates due to an acid generated in the exposed area. Therefore, the solubility of the exposed area of the resist film in the developer can be further reduced, so that a film loss can be further suppressed by the pattern-forming method.

The organic solvent included in the developer is preferably at least one organic solvent selected from the group consisting of ether solvents, ketone solvents, and ester solvents.

If the organic solvent included in the developer is at least one organic solvent selected from the group consisting of ether solvents, ketone solvents, and ester solvents, the solubility of the exposed area in the developer can be further reduced, so that a film loss can be further suppressed.

The above embodiment of the invention also encompasses a developer that is a negative developer used for the resist pattern-forming method and including an organic solvent, the developer including a nitrogen-containing compound.

Since the developer includes the organic solvent and the nitrogen-containing compound, the solubility of the exposed area of the resist film in the developer can be further reduced, so that a film loss can be suppressed. The developer may suitably be used as a negative developer.

The nitrogen-containing compound included in the developer is preferably a compound shown by the following formula (1).

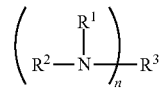

(1)

wherein $R^1$ and $R^2$ individually represent a hydrogen atom, a hydroxyl group, a formyl group, an alkoxy group, an alkoxycarbonyl group, a chain-like hydrocarbon group having 1 to 30 carbon atoms, an alicyclic hydrocarbon group having 3 to 30 carbon atoms, an aromatic hydrocarbon group having 6 to 14 carbon atoms, or a group formed by two or more of these groups, $R^3$ represents a hydrogen atom, a hydroxyl group, a formyl group, an alkoxy group, an alkoxycarbonyl group, an n-valent chain-like hydrocarbon group having 1 to 30 carbon atoms, an n-valent alicyclic hydrocarbon group having 3 to 30 carbon atoms, an n-valent aromatic hydrocarbon group having 6 to 14 carbon atoms, or an n-valent group formed by two or more of these groups, n is an integer equal to or larger than 1, provided that a plurality of $R^1$ and a plurality of $R^2$ may respectively be either the same or different when n is 2 or more, and two of $R^1$ to $R^3$ may bond to form a cyclic structure together with the nitrogen atom bonded thereto.

If the nitrogen-containing compound has the above specific structure, a film loss in the exposed area of the resist film can be further suppressed, and the resulting pattern exhibits reduced LWR and sufficient EL, DOF, and the like.

The embodiments of the invention are described in detail below.

<Pattern-Forming Method>

A pattern-forming method according to one embodiment of the invention includes (1) a step of forming a resist film on a substrate using a photoresist composition, (2) a step of exposing the resist film, and (3) a step of developing the exposed resist film using a negative developer that includes an organic solvent, the photoresist composition including (A) a polymer that includes a structural unit (I) including an acid-labile group that dissociates due to an acid, the solubility of the polymer in the developer decreasing upon dissociation of the acid-labile group, and (B) a photoacid generator, and the developer including a nitrogen-containing compound. Each step, the photoresist composition, and the developer are described in detail below.

[Step (1)]

In the step (1), the photoresist composition is applied to the substrate to form a resist film. A silicon wafer, an aluminum-coated wafer, or the like may be used as the substrate. An organic or inorganic lower-layer antireflective film as disclosed in Japanese Patent Publication (KOKOKU) No. 6-12452, Japanese Patent Application Publication (KOKAI) No. 59-93448, and the like may be formed on the substrate.

The photoresist composition may be applied by spin coating, cast coating, roll coating, or the like. The thickness of the resist film is normally 0.01 to 1 μm, and preferably 0.01 to 0.5 μm.

The resist film formed by applying the photoresist composition may optionally be prebaked (PB) to vaporize the solvent. The PB temperature is appropriately selected depending on the composition of the photoresist composition, but is normally about 30 to about 200° C., and preferably 50 to 150° C.

A protective film as disclosed in Japanese Patent Application Publication (KOKAI) No. 5-188598 and the like may be formed on the resist layer in order to prevent the effects of basic impurities and the like present in the environmental atmosphere. In order to prevent outflow of the acid generator and the like from the resist layer, a liquid immersion lithography protective film as disclosed in Japanese Patent Application Publication (KOKAI) No. 2005-352384 and the like may be formed on the resist layer. These methods may be used in combination.

[Step (2)]

In the step (2), the desired area of the resist film formed by the step (1) is subjected to reduced projection exposure via a mask having a specific pattern and an optional immersion liquid. For example, the desired area of the resist film may be subjected to reduced projection exposure via an isolated line pattern mask to form an isolated space pattern. Likewise, the desired area of the resist film may be subjected to reduced projection exposure via a dot pattern mask to form a hole pattern. The resist film may be exposed two or more times using the desired pattern mask and another pattern mask. In this case, it is preferable to continuously (successively) expose the resist film. For example, the desired area of the resist film is subjected to first reduced projection exposure via a line-and-space pattern mask, and then subjected to second reduced projection exposure so that the exposed areas (lines) intersect. It is preferable that the area subjected to the first reduced projection exposure perpendicularly intersect the area subjected to the second reduced projection exposure. This makes it possible to form a contact hole pattern in the unexposed area enclosed by the exposed area. Examples of the immersion liquid used for exposure include water, a fluorine-containing inert liquid, and the like. It is preferable that the immersion liquid be transparent to the exposure wavelength, and have a temperature coefficient of the refractive index as small as possible so that distortion of an optical image projected onto the film is minimized. When using an ArF excimer laser (wavelength: 193 nm) as the exposure light source, it is preferable to use water from the viewpoint of availability and ease of handling.

Radiation used for exposure is appropriately selected from ultraviolet rays, deep ultraviolet rays, X-rays, charged particle rays, and the like depending on the type of acid generator (B). It is preferable to use deep ultraviolet rays such as ArF excimer laser light or KrF excimer laser light (wavelength: 248 nm). It is more preferable to use ArF excimer laser light. The exposure conditions (e.g., dose) are appropriately selected depending on the composition of the photoresist composition, the type of additive, and the like. The pattern-forming method may include a plurality of exposure steps, as described above. An identical or different light source may be used for each exposure step. Note that it is preferable to use ArF excimer laser light in the first exposure step.

It is preferable to perform post-exposure bake (PEB) after exposure. The acid-labile group included in the photoresist composition dissociates smoothly due to PEB. The PEB temperature is normally 30 to 200° C., and preferably 50 to 170° C.

[Step (3)]

In the step (3), the resist film exposed in the step (2) is developed using a developer according to one embodiment of the invention to form a pattern. The developer is a negative developer that includes an organic solvent, and further includes a nitrogen-containing compound. Since the developer includes the organic solvent and the nitrogen-containing compound, the insolubility of the exposed area of the resist film in the developer can be increased, so that a film loss can be suppressed. The term "negative developer" used herein refers to a developer that selectively dissolves and removes a low-dose exposed area and an unexposed area. The content of the organic solvent in the developer is preferably 80 mass % or more, more preferably 90 mass % or more, and still more preferably 100 mass %. If the content of the organic solvent in the developer is within the above specific range, the dissolution contrast between the exposed area and the unexposed area can be improved, so that a pattern that exhibits excellent lithographic characteristics can be formed. Examples of components other than the organic solvent include water, silicone oil, and the like.

Examples of the organic solvent include alcohol solvents, ether solvents, ketone organic solvents, amide solvents, ester organic solvents, hydrocarbon solvents, and the like.

Examples of the alcohol solvents include monohydric alcohol solvents such as methanol, ethanol, n-propanol, isopropanol, n-butanol, isobutanol, sec-butanol, tert-butanol, n-pentanol, isopentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol, and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol;

polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethyl butyl ether, diethylene glycol monomethyl ether, diethylene glycol monoethyl ether, diethylene glycol monopropyl ether, diethylene glycol monobutyl ether, diethylene glycol monohexyl ether, propylene glycol methyl ether, propylene glycol monoethyl ether, propylene glycol monopropyl ether, propylene glycol monobutyl ether, dipropyleneglycol monomethylether, dipropylene glycol monoethyl ether, and dipropylene glycol monopropyl ether; and the like.

Examples of the ether solvents include anisole, diethyl ether, dipropyl ether, dibutyl ether, tetrahydrofuran, dioxane, diphenyl ether, and the like.

Examples of the ketone solvents include acetone, methyl ethyl ketone, methyl n-propyl ketone, methyl n-butyl ketone, diethyl ketone, methyl isobutyl ketone, methyl n-amyl ketone, ethyl n-butyl ketone, methyl n-hexyl ketone, diisobutyl ketone, trimethylenonane, cyclopentanone, cyclohexanone, cycloheptanone, cyclooctanone, methylcyclohexanone, 2,4-pentanedione, acetonylacetone, acetophenone, and the like.

Examples of the amide solvents include N,N'-dimethylimidazolidinone, N-methylformamide, N,N-dimethylformamide, N,N-dimethylformamide, acetamide, N-methylacetamide, N,N-dimethylacetamide, N-methylpropioneamide, N-methylpyrrolidone, and the like.

Examples of the ester solvents include diethyl carbonate, propylene carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like.

Examples of the hydrocarbon solvents include aliphatic hydrocarbon solvents such as n-pentane, isopentane, n-hexane, isohexane, n-heptane, isoheptane, 2,2,4-trimethylpentane, n-octane, isooctane, cyclohexane, and methylcyclohexane; aromatic hydrocarbon solvents such as benzene, toluene, xylene, mesitylene, ethylbenzene, trimethylbenzene, methylethylbenzene, n-propylbenzene, isopropylbenzene, diethylbenzene, isobutylbenzene, triethylbenzene, diisopropylbenzene, and n-amylnaphthalene; and the like.

Among these, an ether solvent, a ketone solvent, and an ester solvent are preferable. It is more preferable to use n-butyl acetate, isopropyl acetate, amyl acetate, anisole, methyl ethyl ketone, methyl n-butyl ketone, or methyl n-amyl ketone. These organic solvents may be used either individually or in combination.

The nitrogen-containing compound included in the developer interacts with a polar group that is produced in the resist film due to an acid, and further increases the insolubility of the exposed area in the organic solvent. For example, the nitrogen-containing compound reacts with the polar group to form a salt or an ionic bond.

The nitrogen-containing compound is preferably a compound shown by the formula (1).

In the formula (1), $R^1$ and $R^2$ individually represent a hydrogen atom, a hydroxyl group, a formyl group, an alkoxy group, an alkoxycarbonyl group, a chain-like hydrocarbon group having 1 to 30 carbon atoms, an alicyclic hydrocarbon group having 3 to 30 carbon atoms, an aromatic hydrocarbon group having 6 to 14 carbon atoms, or a group formed by two or more of these groups, $R^3$ represents a hydrogen atom, a hydroxyl group, a formyl group, an alkoxy group, an alkoxycarbonyl group, an n-valent chain-like hydrocarbon group having 1 to 30 carbon atoms, an n-valent alicyclic hydrocarbon group having 3 to 30 carbon atoms, an n-valent aromatic hydrocarbon group having 6 to 14 carbon atoms, or an n-valent group formed by two or more of these groups, n is an integer equal to or larger than 1, provided that a plurality of $R^1$ and a plurality of $R^2$ may be either the same or different when n is 2 or more, and two of $R^1$ to $R^3$ may bond to form a cyclic structure together with the nitrogen atom bonded thereto.

Examples of the chain-like hydrocarbon group having 1 to 30 carbon atoms represented by $R^1$ and $R^2$ include a methyl group, an ethyl group, an n-propyl group, an i-propyl group, an n-butyl group, a 2-methylpropyl group, a 1-methylpropyl group, a t-butyl group, and the like.

Examples of the alicyclic hydrocarbon group having 3 to 30 carbon atoms represented by $R^1$ and $R^2$ include a cyclopropyl group, a cyclopentyl group, a cyclohexyl group, an adamantyl group, a norbornyl group, and the like.

Examples of the aromatic hydrocarbon group having 6 to 14 carbon atoms represented by $R^1$ and $R^2$ include a phenyl group, a tolyl group, a naphthyl group, and the like.

Examples of the group formed by two or more of these groups represented by $R^1$ and $R^2$ include aralkyl groups having 6 to 12 carbon atoms such as a benzyl group, a phenethyl group, a naphthylmethyl group, and a naphthylethyl group, and the like.

Examples of the n-valent chain-like hydrocarbon group having 1 to 30 carbon atoms represented by $R^3$ include groups obtained by elimination of (n−1) hydrogen atoms from the groups mentioned above as examples of the chain-like hydrocarbon group having 1 to 30 carbon atoms represented by $R^1$ and $R^2$, and the like.

Examples of the n-valent alicyclic hydrocarbon group having 3 to 30 carbon atoms represented by $R^3$ include groups obtained by elimination of (n−1) hydrogen atoms from the groups mentioned above as examples of the alicyclic hydrocarbon group having 3 to 30 carbon atoms represented by $R^1$ and $R^2$, and the like.

Examples of the n-valent aromatic hydrocarbon group having 6 to 14 carbon atoms represented by $R^3$ include groups obtained by elimination of (n−1) hydrogen atoms from the groups mentioned above as examples of the aromatic hydrocarbon group having 6 to 14 carbon atoms represented by $R^1$ and $R^2$, and the like.

Examples of the group formed by two or more of these groups represented by $R^3$ include groups obtained by elimination of (n−1) hydrogen atoms from the groups mentioned above as examples of the group formed by two or more of these groups represented by $R^1$ and $R^2$, and the like.

The groups represented by $R^1$ to $R^3$ may be substituted with a substituent. Specific examples of the substituent include a methyl group, an ethyl group, a propyl group, an n-butyl group, a t-butyl group, a hydroxyl group, a carboxyl group, a halogen atom, an alkoxy group, and the like. Examples of the halogen atom include a fluorine atom, a chlorine atom, a bromine atom, and the like. Examples of the alkoxy group include a methoxy group, an ethoxy group, a propoxy group, a butoxy group, and the like.

Examples of the compound shown by the formula (1) include (cyclo)alkylamine compounds, nitrogen-containing heterocyclic compounds, amide group-containing compounds, urea compounds and the like.

Examples of the (cyclo)alkylamine compounds include compounds including one nitrogen atom, compounds including two nitrogen atoms, compounds including three or more nitrogen atoms, and the like.

Examples of the (cyclo)alkylamine compounds including one nitrogen atom include mono(cyclo)alkylamines such as n-hexylamine, n-heptylamine, n-octylamine, n-nonylamine, 1-aminodecane, and cyclohexylamine;
di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine;
tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine;
substituted alkylamines such as triethanolamine; and
aromatic amines such as aniline, N-methylaniline, N,N-dimethylaniline, 2-methylaniline, 3-methylaniline, 4-methylaniline, N,N-dibutylaniline, 4-nitroaniline, diphenylamine, triphenylamine, naphthylamine, 2,4,6-tri-tert-butyl-N-methylaniline, N-phenyldiethanolamine, 2,6-diisopropylaniline, 2-(4-aminophenyl)-2-(3-hydroxyphenyl)propane, and 2-(4-aminophenyl)-2-(4-hydroxyphenyl)propane.

Examples of the (cyclo)alkylamine compounds including two nitrogen atoms include ethylenediamine, N,N,N',N'-tetramethylethylenediamine, tetramethylenediamine, hexamethylenediamine, 4,4'-diaminodiphenylmethane, 4,4'-diamino diphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 1,4-bis[1-(4-aminophenyl)-1-methylethyl]benzene, 1,3-bis[1-(4-aminophenyl)-1-methylethyl]benzene, bis(2-dimethylaminoethyl) ether, bis(2-diethylaminoethyl) ether, 1-(2-hydroxyethyl)-2-imidazolizinone, 2-quinoxalinol, N,N,N',N'-tetrakis(2-hydroxypropyl)ethylenediamine, and the like.

Examples of the (cyclo)alkylamine compounds including three or more nitrogen atoms include polyethyleneimine, polyallylamine, poly(2-dimethylaminoethylacrylamide), and the like.

Examples of the nitrogen-containing heterocyclic compounds include nitrogen-containing aromatic heterocyclic compounds, nitrogen-containing aliphatic heterocyclic compounds, and the like.

Examples of the nitrogen-containing aromatic heterocyclic compounds include imidazoles such as imidazole, 4-methylimidazole, 4-methyl-2-phenylimidazole, benzimidazole, 2-phenylbenzimidazole, 1-benzyl-2-methylimidazole, and 1-benzyl-2-methyl-1H-imidazole; and
pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, acridine, and 2,2':6',2"-tarpyridine.

Examples of the nitrogen-containing aliphatic heterocyclic compounds include piperazines such as piperazine and 1-(2-hydroxyethyl)piperazine; pyrazine, pyrazole, pyridazine, quinoxaline, purine, pyrrolidine, proline, piperidine, piperidine ethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like.

Examples of the amide group-containing compounds include N-t-butoxycarbonyl group-containing amino compounds such as N-t-butoxycarbonyldi-n-octylamine, N-t-butoxycarbonyldi-n-nonylamine, N-t-butoxycarbonyldi-n-decylamine, N-t-butoxycarbonyldicyclohexylamine, N-t-butoxycarbonyl-1-adamantylamine, N-t-butoxycarbonyl-2-adamantylamine, N-t-butoxycarbonyl-N-methyl-1-adamantylamine, (S)-(–)-1-(t-butoxycarbonyl)-2-pyrrolidinemethanol, (R)-(+)-1-(t-butoxycarbonyl)-2-pyrrolidinemethanol, N-t-butoxycarbonyl-4-hydroxypiperidine, N-t-butoxycarbonylpyrrolidine, N-t-butoxycarbonylpiperazine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminoöctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole; formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl) isocyanurate, and the like.

Examples of the urea compounds include urea, methylurea, 1,1-dimethylurea, 1,3-dimethylurea, 1,1,3,3-tetramethylurea, 1,3-diphenylurea, tri-n-butylthiourea, and the like.

Among these, the (cyclo)alkylamine compounds and the nitrogen-containing aliphatic heterocyclic compounds are preferable, and 1-aminodecane, di-n-octylamine, tri-n-octylamine, N,N-dibutylaniline, and proline are more preferable.

An appropriate amount of surfactant may optionally be added to the developer. An ionic or nonionic fluorine-containing and/or silicon-containing surfactant or the like may be used as the surfactant.

Examples of the development method include a dipping method that immerses the substrate in a container filled with the developer for a given time, a puddle method that allows the developer to be present on the surface of the substrate due to surface tension for a given time, a spray method that sprays the developer onto the surface of the substrate, a dynamic dispensing method that applies the developer to the substrate that is rotated at a constant speed while scanning a developer application nozzle at a constant speed, and the like.

It is preferable to rinse the resist film with a rinse agent after the step (3). An organic solvent may be used as the rinse agent. Scum can be efficiently washed away by utilizing the organic solvent as the rinse agent.

A hydrocarbon solvent, a ketone solvent, an ester solvent, an alcohol solvent, an amide solvent, or the like is preferable as the organic solvent used as the rinse agent. Among these, an alcohol solvent and an ester solvent are preferable, and an alcohol solvent is more preferable. A monohydric alcohol having 6 to 8 carbon atoms is particularly preferable as the alcohol solvent.

Examples of the monohydric alcohol solvent having 6 to 8 carbon atoms include linear, branched, or cyclic monohydric alcohols such as 1-hexanol, 1-heptanol, 1-octanol, 4-methyl-2-pentanol, 2-hexanol, 2-heptanol, 2-octanol, 3-hexanol, 3-heptanol, 3-octanol, 4-octanol, and benzyl alcohol. Among these, 1-hexanol, 2-hexanol, 2-heptanol, and 4-methyl-2-pentanol are preferable.

The rinse agent may include one or more components. The water content in the rinse agent is preferably 10 mass % or less, more preferably 5 mass % or less, and still more preferably 3 mass % or less. If the water content in the rinse agent is 10 mass % or less, excellent developability can be obtained. Note that a surfactant may be added to the rinse agent.

Examples of the rinsing method using the rinse agent include a spin rinsing method that applies the rinse agent to the substrate that is rotated at a constant speed, a dipping method that immerses the substrate in a container filled with the rinse agent for a given time, a spray method that sprays the rinse agent onto the surface of the substrate, and the like.

<Photoresist Composition>

The photoresist composition used for the pattern-forming method according to one embodiment of the invention includes the polymer (A) and the acid generator (B). The photoresist composition preferably further includes (C) a fluorine-containing polymer, (D) an acid diffusion controller, and (E) a solvent. The photoresist composition may further include an additional optional component as long as the effects of the invention are not impaired. Each component is described in detail below.

<Polymer (A)>

The polymer (A) includes a structural unit (I) including an acid-labile group that dissociates due to an acid, the solubility of the polymer (A) in the developer decreasing upon dissociation of the acid-labile group. The acid-labile group included in the structural unit (I) dissociates due to an acid generated by the acid generator (B) upon exposure, so that a polar group such as a carboxyl group is produced. As a result, the solubility of the polymer (A) in the negative developer that includes the organic solvent decreases, so that an excellent resist pattern can be formed. The nitrogen-containing compound included in the developer used for the pattern-forming method interacts with the polar group, and further decreases the solubility of the polymer (A) in the developer. Therefore, a film loss of the resist film in the pattern-forming step can be suppressed. Note that the term "polar group" used herein refers to a group having high polarity, such as a carboxyl group, a hydroxyl group, an amino group, and a sulfo group. Note that the polymer (A) preferably include a structural unit (II) including a lactone group or a cyclic carbonate group in addition to the structural unit (I), and may also include an additional structural unit such as a structural unit (III) including a polar group, as long as the effects of the invention are not impaired. The polymer (A) may include only one type of each structural unit, or may include two or more types of each structural unit.

[Structural unit (I)]

The structural unit (I) includes an acid-labile group that dissociates due to an acid. The structural unit (I) is preferably a structural unit that includes a group shown by the formula (2). If the structural unit (I) includes a group shown by the formula (2), a carboxyl group having high polarity is produced in the resist film used for the pattern-forming method due to an acid. The carboxyl group interacts with the nitrogen-containing compound included in the developer, so that the solubility of the exposed area of the resist film in the developer can be further reduced. Therefore, a film loss in the exposed area can be further suppressed. Moreover, the resulting pattern exhibits reduced LWR and sufficient EL, DOF, and the like. The structural unit (I) is preferably a structural unit shown by the formula (3).

In the formula (2), $R^p$ represents an acid-labile group.

The acid-labile group represented by $R^p$ is preferably a group shown by the formula (4).

In the formula (4), $R^{p1}$ to $R^{p3}$ represent an alkyl group having 1 to 4 carbon atoms or an alicyclic hydrocarbon group having 4 to 20 carbon atoms, provided the alkyl group or the alicyclic hydrocarbon group may be substituted with a substituent, and $R^{p2}$ and $R^{p3}$ may bond to form a divalent alicyclic hydrocarbon group having 4 to 20 carbon atoms together with the carbon atom bonded thereto.

Examples of the alkyl group having 1 to 4 carbon atoms represented by $R^{p1}$ to $R^{p3}$ include a methyl group, an ethyl group, an n-propyl group, an i-propyl group, an n-butyl group, a 2-methylpropyl group, a 1-methylpropyl group, a t-butyl group, and the like.

Examples of the alicyclic hydrocarbon group having 4 to 20 carbon atoms represented by $R^{p1}$ to $R^{p3}$ include polyalicyclic hydrocarbon groups including a bridged skeleton (e.g., adamantane skeleton or norbornane skeleton); and monoalicyclic hydrocarbon groups including a cycloalkane skeleton (e.g., cyclopentane skeleton or cyclohexane skeleton). Some or all of the hydrogen atoms of these groups may be substituted with at least one linear, branched, or cyclic alkyl group having 1 to 10 carbon atoms, for example.

It is preferable that $R^{p1}$ represent an alkyl group having 1 to 4 carbon atoms, and $R^{p2}$ and $R^{p3}$ bond to form a divalent group including an adamantane skeleton or a cycloalkane skeleton together with the carbon atom bonded thereto.

The group shown by the formula (2) may be bonded to an arbitrary position of the structural unit (I). For example, the group shown by the formula (2) may be bonded directly to the main chain of the polymer, or may be bonded to the side chain of the polymer.

The structural unit shown by the formula (3) is preferable as the structural unit (I). Examples of the structural unit shown by the formula (3) include structural units shown by the following formulas (1-1) to (4-4), and the like.

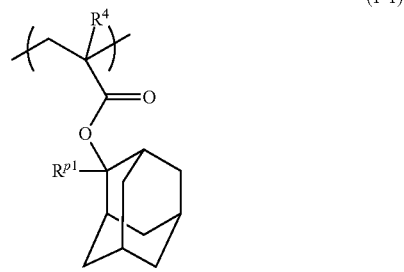

(1-1)

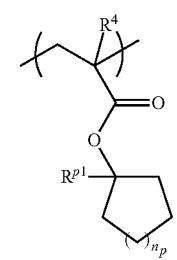

(1-2)

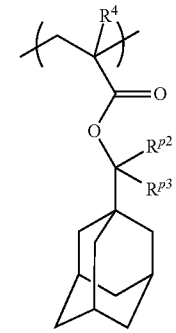

(1-3)

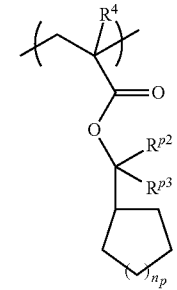

(1-4)

wherein $R^4$ is the same as defined for the formula (3), $R^{p1}$ to $R^{p3}$ are the same as defined for the formula (4), and $n_p$ is an integer from 1 to 4.

The content of the structural unit (I) in the polymer (A) is preferably 20 to 80 mol %, and more preferably 30 to 70 mol %. If the content of the structural unit (I) is within the above range, the lithographic characteristics when using the pattern-forming method can be further improved.

[Structural Unit (II)]

It is preferable that the polymer (A) include the structural unit (II) that includes a lactone group and a cyclic carbonate group. If the polymer (A) includes the structural unit (II), the adhesion of the resist film to the substrate can be improved. The term "lactone group" used herein refers to a group that includes one ring (lactone ring) including a structure shown by —O—C(O)—. The term "cyclic carbonate group" used herein refers to a group that includes one ring (cyclic carbonate ring) including a structure shown by —O—C(O)—O—. A group that includes only one lactone ring or cyclic carbonate ring is referred to as a monocyclic group, and a group that further includes another cyclic structure is referred to as a polycyclic group.

Examples of the structural unit (II) include structural units shown by the following formulas.

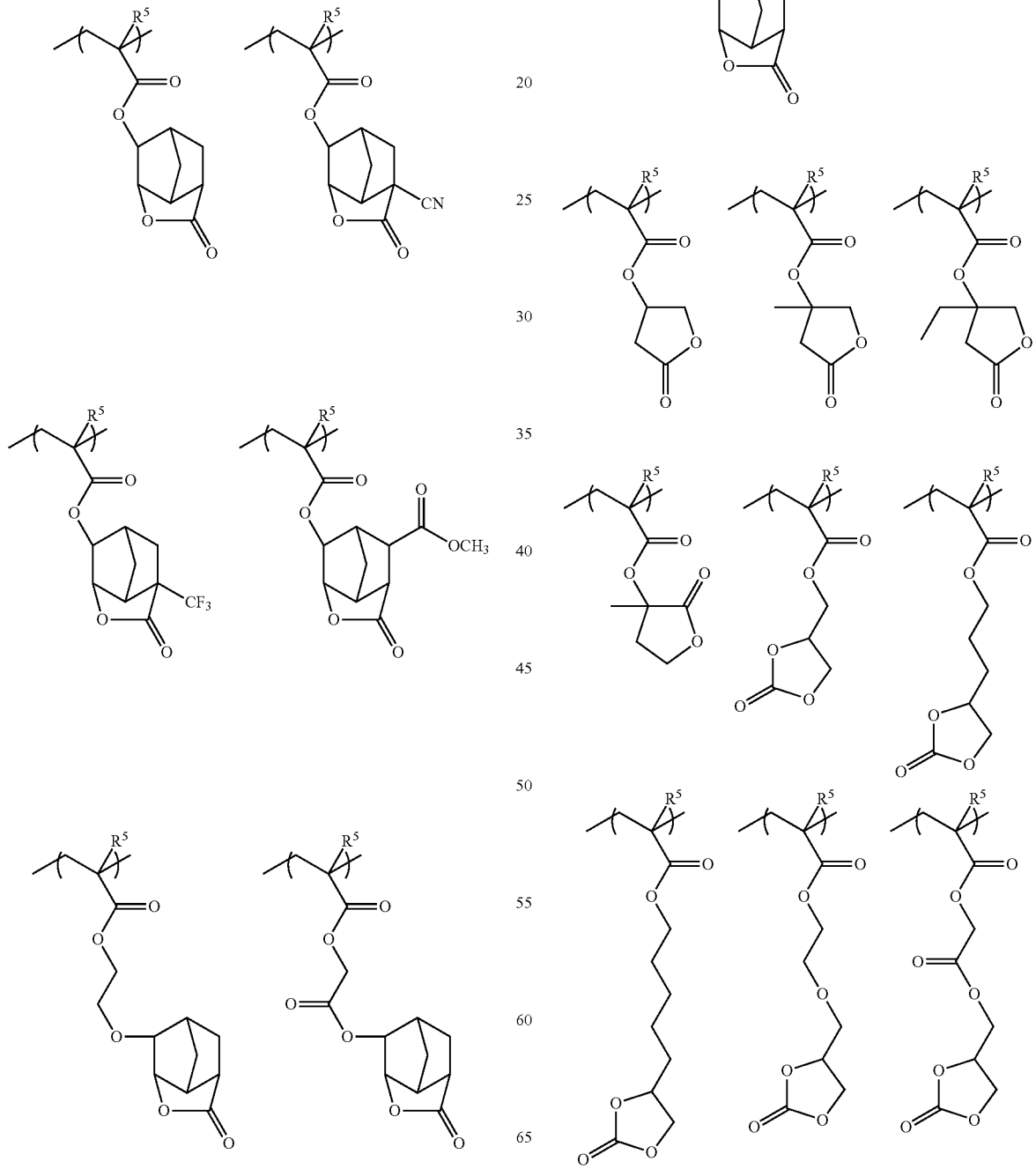

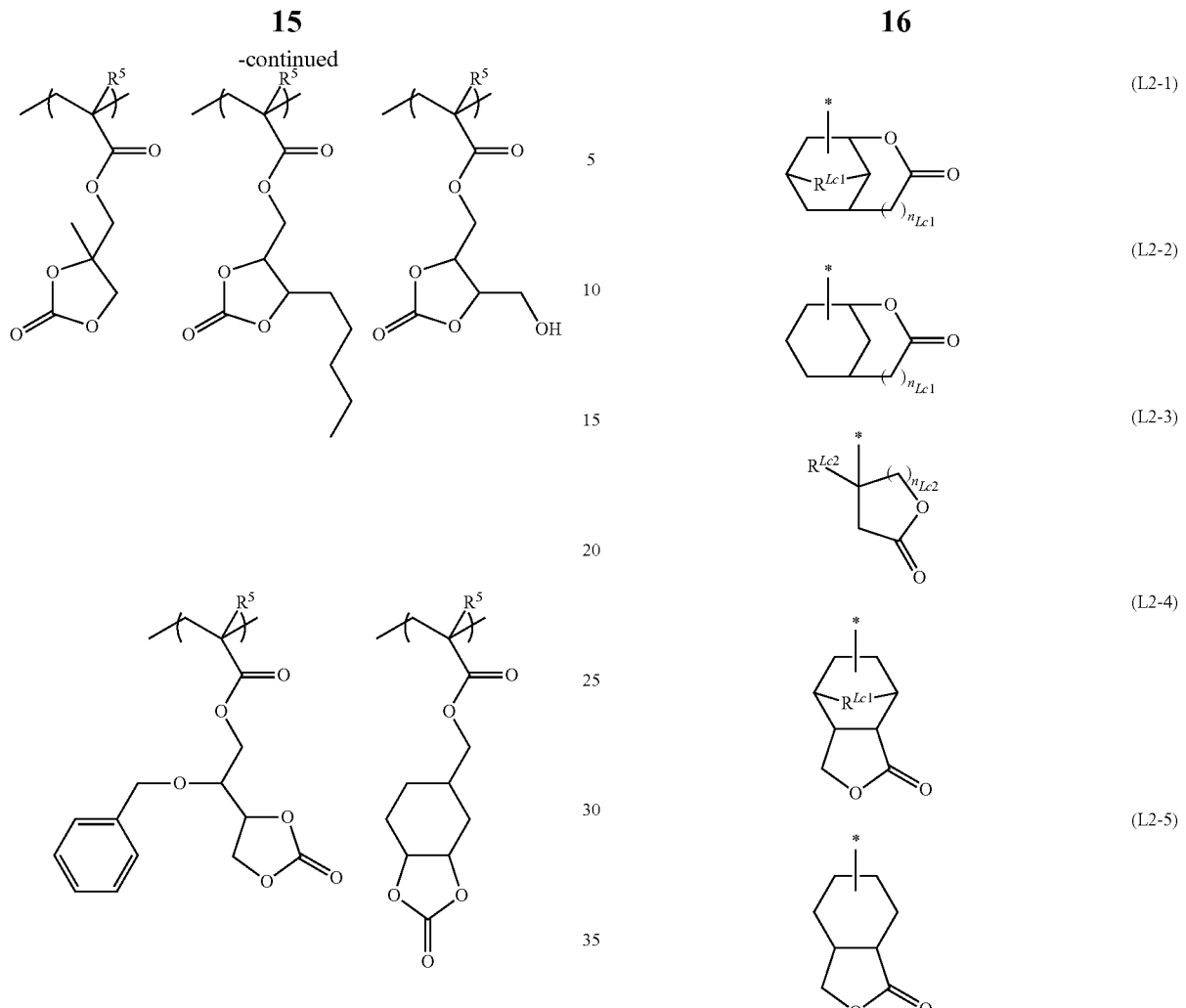

wherein R⁵ represents a hydrogen atom, a fluorine atom, a methyl group, or a trifluoromethyl group.

Examples of a monomer that produces the structural unit (II) include the monomers disclosed in WO2007/116664, monomers shown by the following formula (5), and the like.

wherein R⁵ represents a hydrogen atom, a fluorine atom, a methyl group, or a trifluoromethyl group, $R^{L1}$ represents a single bond or a divalent linking group, and $R^{L2}$ represents a lactone group or a cyclic carbonate group.

Examples of the divalent linking group represented by $R^{L1}$ divalent linear or branched hydrocarbon groups having 1 to 20 carbon atoms, and the like.

Examples of the lactone group represented by $R^{L2}$ include groups shown by the following formulas (L2-1) to (L2-6). Examples of the cyclic carbonate group represented by $R^{L2}$ include groups shown by the following formulas (L2-7) and (L2-8).

wherein $R^{Lc1}$ represents an oxygen atom or a methylene group, $R^{Lc2}$ represents a hydrogen atom or an alkyl group having 1 to 4 carbon atoms, $n_{Lc1}$ is 0 or 1, $n_{Lc2}$ is an integer from 0 to 3, $n_{C1}$ is an integer from 0 to 2, $n_{C2}$ to $n_{C5}$ are individually an integer from 0 to 2, and * represents a site bonded to $R^{L2}$ in the formula (5), provided that the groups shown by the formulas (L2-1) to (L2-8) may be substituted with a substituent.

The content of the structural unit (II) in the polymer (A) is preferably 25 to 65 mol %, and more preferably 35 to 55 mol %. If the content of the structural unit (II) is within the above range, the adhesion of the resist film to the substrate, and the like are further improved.

The polymer (A) may include an additional structural unit other than the structural units (I) and (II). Examples of the additional structural unit include a structural unit (III) that includes a polar group, and the like.

[Structural Unit (III)]

It is preferable that the polymer (A) further include the structural unit (III) that includes a polar group. If the polymer (A) includes the structural unit (III), the mutual solubility of the polymer (A) and another component (e.g., acid generator (B)) is improved, so that the lithography performance of a pattern obtained by the pattern-forming method can be improved. Examples of the structural unit (III) include structural units shown by the following formulas, and the like.

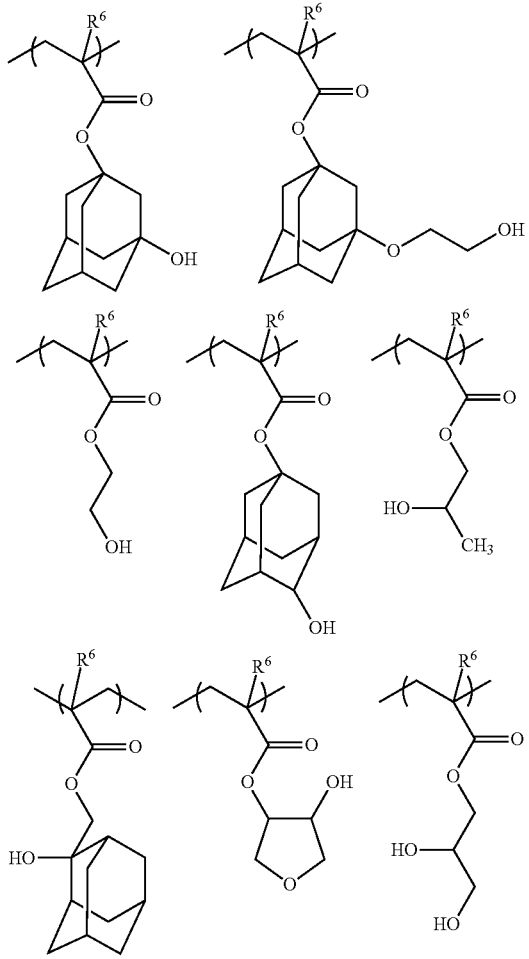

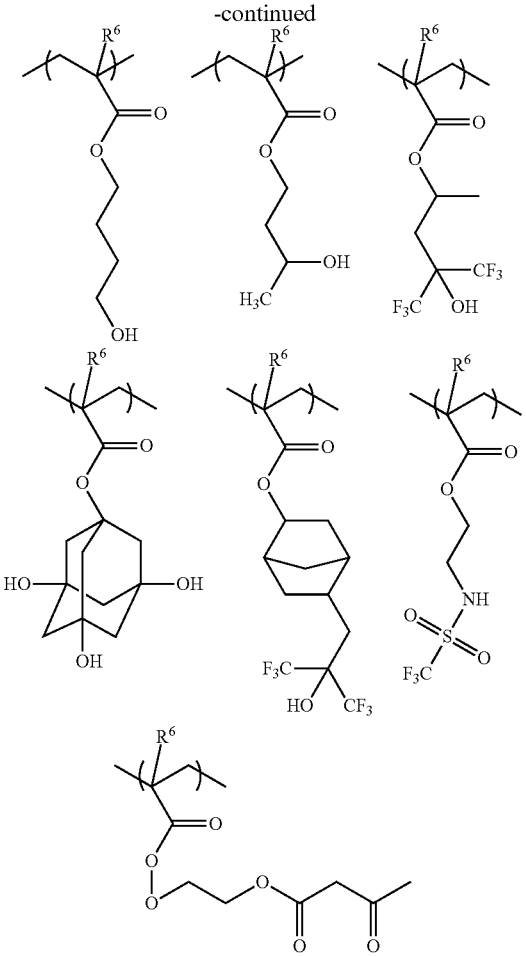

wherein $R^6$ represents a hydrogen atom, a fluorine atom, a methyl group, or a trifluoromethyl group.

The content of the structural unit (III) in the polymer (A) is preferably 0 to 30 mol %, and more preferably 0 to 20 mol %.

<Synthesis of Polymer (A)>

The polymer (A) may be produced by polymerizing a monomer that produces each structural unit in an appropriate solvent using a radical initiator, for example. The polymer (A) is preferably produced by polymerizing a monomer by adding a solution containing a monomer and a radical initiator dropwise to a solution containing a reaction solvent or a monomer, polymerizing a monomer by adding a solution containing a monomer and a solution containing a radical initiator dropwise to a solution containing a reaction solvent or a monomer, or polymerizing a plurality of types of monomers by adding a plurality of solutions containing a different monomer and a solution containing a radical initiator dropwise to a solution containing a reaction solvent or a monomer, for example.

Examples of the solvent used for polymerization include alkanes such as n-pentane, n-hexane, n-heptane, n-octane, n-nonane, and n-decane;

cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene;

saturated carboxylic acid esters such as ethyl acetate, n-butyl acetate, i-butyl acetate, and methyl propionate;
ketones such as acetone, 2-butanone, 4-methyl-2-pentanone, and 2-heptanone; ethers such as tetrahydrofuran, dimethoxyethanes, and diethoxyethanes;
alcohols such as methanol, ethanol, 1-propanol, 2-propanol, and 4-methyl-2-pentanol; and the like. These solvents may be used either individually or in combination.

The polymerization temperature may be appropriately determined depending on the type of radical initiator, but is normally 40 to 150° C., and preferably 50 to 120° C. The polymerization (reaction) time is normally 1 to 48 hours, and preferably 1 to 24 hours.

Examples of the radical initiator used for polymerization include azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile), 2,2'-azobis(2 methylpropionitrile), and the like. These initiators may be used either individually or in combination.

The polymer obtained by polymerization is preferably collected by re-precipitation. Specifically, the polymer solution is poured into a re-precipitation solvent after completion of polymerization to collect the target resin as a powder. An alcohol, an alkane, and the like may be used as the re-precipitation solvent either individually or in combination. The polymer may also be collected by removing low-molecular-weight components (e.g., monomer and oligomer) by a separation operation, a column operation, ultrafiltration, or the like.

The weight average molecular weight (Mw) of the polymer (A) determined by gel permeation chromatography (GPC) is preferably 1000 to 100,000, more preferably 1000 to 50,000, and still more preferably 1000 to 30,000. If the Mw of the polymer (A) is within the above range, a film loss can be suppressed, and the resulting pattern exhibits reduced LWR.

The ratio (Mw/Mn) of the Mw to the number average molecular weight (Mn) of the polymer (A) is normally 1 to 5, preferably 1 to 3, and more preferably 1 to 2. If the ratio (Mw/Mn) of the polymer (A) is within the above range, the resulting pattern exhibits reduced LWR.

Note that the terms "Mw" and "Mn" used herein refer to values determined by gel permeation chromatography (GPC) using GPC columns manufactured by Tosoh Corp. (G2000HXL×2, G3000HXL×1, G4000HXL×1) (standard: monodisperse polystyrene, flow rate: 1.0 ml/min, eluant: tetrahydrofuran, sample concentration: 1.0 mass %, amount of sample injected: 100 μl, column temperature: 40° C.).
<Acid Generator (B)>

The acid generator (B) is a compound that generates an acid upon exposure to radiation in the exposure step of the pattern-forming method. The acid-labile group included in the polymer (A) dissociates due to the acid generated by the acid generator (B), so that a polar group such as a carboxyl group is produced. As a result, the polymer (A) becomes scarcely soluble in the developer. The acid generator (B) may be included in the photoresist composition as a compound (described below), or may be included in the polymer.

Examples of the acid generator (B) include onium salt compounds, sulfonimide compounds, halogen-containing compounds, diazoketone compounds, and the like. Among these, it is preferable to use an onium salt compound as the acid generator (B).

Examples of the onium salt compounds include sulfonium salts (including tetrahydrothiophenium salts), iodonium salts, phosphonium salts, diazonium salts, pyridinium salts, and the like.

Examples of the sulfonium salts include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium camphorsulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-cyclohexylphenyldiphenylsulfonium camphorsulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, 4-methanesulfonylphenyldiphenylsulfonium camphorsulfonate, triphenylphosphonium 1,1,2,2-tetrafluoro-6-(1-adamantanecarbonyloxy)-hexane-1-sulfonate, triphenylsulfonium norbornyldifluoroethanesulfonate, and the like. Among these, 4-cyclohexylphenyldiphenylsulfonium nonafluoro-n-butanesulfonate, triphenylsulfonium norbornyldifluoroethanesulfonate, triphenylsulfonium trifluoromethanesulfonate, triphenylsulfonium nonafluoro-n-butanesulfonate, and triphenylphosphonium 1,1,2,2-tetrafluoro-6-(1-adamantanecarbonyloxy)-hexane-1-sulfonate are preferable.

Examples of the tetrahydrothiophenium salts include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(4-n-butoxynaphthalen-1-yl)tetrahydrothiophenium camphorsulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate, 1-(6-n-butoxynaphthalen-2-yl)tetrahydrothiophenium camphorsulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium camphorsulfonate, and the like. Among these, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, and 1-(3,5-dimethyl-4-hydroxyphenyl)tetrahydrothiophenium nonafluoro-n-butanesulfonate are preferable.

Examples of the iodonium salts include diphenyliodonium trifluoromethanesulfonate, diphenyliodonium nona fluoro-n-butanesufonate, diphenyliodonium perfluoro-n-octanesulfonate, diphenyliodonium 2-bicyclo[2.2.1]hept-2-yl-1,1,2,2-tetrafluoroethanesulfonate, diphenyliodonium camphorsulfonate, bis(4-t-butylphenyl)iodonium trifluoromethanesulfonate, bis(4-t-butylphenyl)iodonium nonafluoro-n-butanesufonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethane-sulfonate, bis(4-t-butylphenyl)iodonium camphorsulfonate, and the like. Among these, bis(4-t-butylphenyl)iodonium nonafluoro-n-butanesulfonate is preferable.

These acid generators (B) may be used either individually or in combination. The acid generator (B) is normally used in an amount of 0.1 to 30 parts by mass, and preferably 0.5 to 20 parts by mass, based on 100 parts by mass of the polymer (A), so that the resulting resist exhibits sufficient sensitivity and developability. If the amount of the acid generator (B) is less than 0.1 part by mass, the resulting resist may exhibit insufficient sensitivity. If the amount of the acid generator (B) exceeds 30 parts by mass, the desired resist pattern may not be obtained due to a decrease in radiation transmittance.

<Fluorine-Containing Polymer (C)>

The photoresist composition used for the pattern-forming method preferably includes the fluorine-containing polymer (C) (hereinafter may be referred to as "polymer (C)"). When the photoresist composition includes the polymer (C), the polymer (C) tends to be distributed in the surface layer of the resist film due to the oil repellency of the polymer (C), so that elution of the acid generator, an acid diffusion controller, and the like into an immersion medium during liquid immersion lithography can be suppressed. Note that the polymer (C) excludes a polymer that falls under the polymer (A).

The polymer (C) may be produced by polymerizing one or more fluorine-containing monomers.

The polymer (C) preferably includes a structural unit (F-I) shown by the following formula (6).

structural unit (F-I) is less than 5 mol %, the receding contact angle may be less than 70°, or elution of the acid generator and the like from the resist film may not be suppressed. The polymer (C) may include only one type of structural unit (F-I), or may include two or more types of structural unit (F-I).

The polymer (C) may include one or more additional structural units (e.g., a structural unit that includes an acid-labile group and controls the dissolution rate of the polymer in the developer, a structural unit that includes a lactone group or a cyclic carbonate group, a structural unit that includes a hydroxyl group, a carboxyl group, or the like, a structural unit that includes an alicyclic group, or a structural unit that is derived from an aromatic compound and suppresses scattering of light due to reflection from the substrate) other than the fluorine-containing structural unit.

Examples of the structural unit that includes an acid-labile group include the structural units mentioned above in connection with the structural unit (I) of the polymer (A).

Examples of the structural unit that includes a lactone group or a cyclic carbonate group include the structural units mentioned above in connection with the structural unit (II) of the polymer (A).

Examples of the structural unit that includes a hydroxyl group, a carboxyl group, or the like include the structural units mentioned above in connection with the structural unit (III) of the polymer (A).

Examples of a structural unit (F-IV) that includes an alicyclic group include a structural unit shown by the following formula (7), and the like.

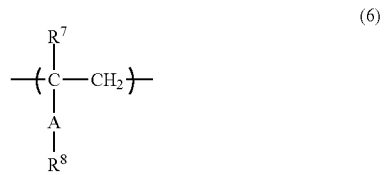

(6)

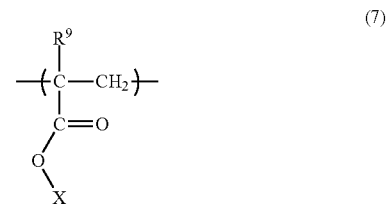

(7)

wherein $R^7$ represents a hydrogen atom, a fluorine atom, a methyl group, or a trifluoromethyl group, A represents a single bond or a divalent linking group, and $R^8$ represents a linear or branched alkyl group having 1 to 6 carbon atoms that includes at least one fluorine atom, a monovalent alicyclic hydrocarbon group having 4 to 20 carbon atoms, or a derivative thereof Examples of the divalent linking group represented by A include an oxygen atom, a sulfur atom, a carbonyloxy group, an oxycarbonyl group, an amide group, a sulfonylamide group, a urethane group, and the like.

Examples of a preferable monomer that produces the structural unit (F-I) include trifluoromethyl (meth)acrylate, 2,2,2-trifluoroethyl (meth)acrylate, perfluoroethyl (meth)acrylate, perfluoro-n-propyl (meth)acrylate, perfluoro-i-propyl (meth) acrylate, perfluoro-n-butyl (meth)acrylate, perfluoro-i-butyl (meth)acrylate, perfluoro-t-butyl (meth)acrylate, 2-(1,1,1,3, 3,3-hexafluoropropyl) (meth)acrylate, 1-(2,2,3,3,4,4,5,5-octafluoropentyl) (meth)acrylate, perfluorocyclohexylmethyl (meth)acrylate, 1-(2,2,3,3,3-pentafluoropropyl) (meth)acrylate, 1-(3,3,4,4,5,5,6,6,7,7,8,8,9,9,10,10,10-heptadecafluorodecyl) (meth)acrylate, 1-(5-trifluoromethyl-3,3,4,4,5,6,6, 6-octafluorohexyl) (meth)acrylate, and the like.

The content of the structural unit (F-I) in the polymer (C) is normally 5 mol % or more, preferably 10 mol % or more, and more preferably 15 mol % or more. If the content of the wherein $R^9$ represents a hydrogen atom, a fluorine atom, a methyl group, or a trifluoromethyl group, and X represents a monovalent alicyclic hydrocarbon group having 4 to 20 carbon atoms.

Examples of the monovalent alicyclic hydrocarbon group having 4 to 20 carbon atoms represented by X include hydrocarbon groups including an alicyclic ring derived from a cycloalkane such as cyclobutane, cyclopentane, cyclohexane, bicyclo[2.2.1]heptane, bicyclo[2.2.2]octane, tricyclo [5.2.1.0$^{2,6}$]decane, tetracyclo[6.2.1.1$^{3,6}$.0$^{2,7}$]dodecane, or tricyclo[3.3.1.1$^{3,7}$]decane. The alicyclic ring derived from a cycloalkane may be substituted with at least one linear or branched alkyl group having 1 to 4 carbon atoms (e.g., methyl group, ethyl group, n-propyl group, i-propyl group, an n-butyl group, 2-methylpropyl group, 1-methylpropyl group, or t-butyl group) or cycloalkyl group having 3 to 10 carbon atoms. The alicyclic ring derived from a cycloalkane may be substituted with a hydroxyl group, a cyano group, a hydroxyalkyl group having 1 to 10 carbon atoms, a carboxyl group, or an oxygen atom.

Examples of a preferable monomer that produces the structural unit (F-IV) include bicyclo[2.2.1]hept-2-yl (meth)acrylate, bicyclo[2.2.2]oct-2-yl (meth)acrylate, tricyclo[5.2.1.0$^{2,}$ $_{6}$]dec-7-yl (meth)acrylate, tetracyclo[6.2.1.1$^{3,6}$0.0$^{2,7}$]dodec- 9-yl (meth)acrylate, tricyclo[3.3.1.1$^{3,7}$]dec-1-yl (meth)acrylate, and tricyclo[3.3.1.1$^{3,7}$]dec-2-yl (meth)acrylate.

Examples of a preferable monomer that produces the structural unit derived from an aromatic compound (hereinafter may be referred to as "structural unit (F-V)") include styrene, α-methylstyrene, 2-methylstyrene, 3-methylstyrene, 4-methylstyrene, 2-methoxystyrene, 3-methoxystyrene, 4-methoxystyrene, 4-(2-t-butoxycarbonylethyloxy)styrene, 2-hydroxystyrene, 3-hydroxystyrene, 4-hydroxystyrene, 2-hydroxy-α-methylstyrene, 3-hydroxy-α-methylstyrene, 4-hydroxy-α-methylstyrene, 2-methyl-3-hydroxystyrene, 4-methyl-3-hydroxystyrene, 5-methyl-3-hydroxystyrene, 2-methyl-4-hydroxystyrene, 3-methyl-4-hydroxystyrene, 3,4-dihydroxystyrene, 2,4,6-trihydroxystyrene, 4-t-butoxystyrene, 4-t-butoxy-α-methylstyrene, 4-(2-ethyl-2-propoxy)styrene, 4-(2-ethyl-2-propoxy)-α-methylstyrene, 4-(1-ethoxyethoxy)styrene, 4-(1-ethoxyethoxy)-α-methylstyrene, phenyl (meth)acrylate, benzyl (meth)acrylate, acenaphthylene, 5-hydroxyacenaphthylene, 1-vinylnaphthalene, 2-vinylnaphthalene, 2-hydroxy-6-vinylnaphthalene, 1-naphthyl (meth)acrylate, 2-naphthyl (meth)acrylate, 1-naphthylmethyl (meth)acrylate, 1-anthryl (meth)acrylate, 2-anthryl (meth)acrylate, 9-anthryl (meth)acrylate, 9-anthrylmethyl (meth)acrylate, and 1-vinylpyrene.

The polymer (C) may include only one type of each of the structural units (II), (III), (F-IV), and (F-V), or may include two or more types of each of the structural units (II), (III), (F-IV), and (F-V). The content of these additional structural units in the polymer (C) is normally 80 mol % or less, preferably 75 mol % or less, and more preferably 70 mol % or less.

<Synthesis of Polymer (C)>

The polymer (C) may be synthesized by polymerizing a monomer that produces each structural unit in an appropriate solvent using a radical initiator, for example. Examples of the initiator, the solvent, and the like used to synthesize the polymer (C) include those mentioned above in connection with synthesis of the polymer (A).

The polymerization temperature is normally 40 to 150° C., and preferably 50 to 120° C. The polymerization time is normally 1 to 48 hours, and preferably 1 to 24 hours.

The polystyrene-reduced weight average molecular weight (Mw) of the polymer (C) determined by gel permeation chromatography (GPC) is preferably 1000 to 50,000, more preferably 1000 to 30,000, and particularly preferably 1000 to 10,000. If the Mw of the polymer (C) is less than 1000, a sufficient receding contact angle may not be obtained. If the Mw of the polymer (C) exceeds 50,000, the resulting resist may exhibit low developability.

The ratio (Mw/Mn) of the Mw to the polystyrene-reduced number average molecular weight (Mn) of the polymer (D) is normally 1 to 3, and preferably 1 to 2.5.

<Acid Diffusion Controller (D)>

The acid diffusion controller (D) controls a phenomenon in which an acid generated by the acid generator (B) upon exposure is diffused in the resist film, and suppresses undesired chemical reactions in the unexposed area. If the photoresist composition includes the acid diffusion controller (D), the storage stability of the photoresist composition and the resolution of the resulting resist are further improved. Moreover, the acid diffusion controller (D) suppresses a change in line width of the resist pattern due to a change in post-exposure delay, so that a composition that exhibits remarkably superior process stability can be obtained. Note that the acid diffusion controller (D) may be included in the photoresist composition as a free compound, or may be included in the polymer.

Examples of the acid diffusion controller (D) include amine compounds, amide group-containing compounds, urea compounds, nitrogen-containing heterocyclic compounds, and the like.

Examples of the amine compounds include mono(cyclo)alkylamines, di(cyclo)alkylamines, tri(cyclo)alkylamines, substituted-alkylaniline or derivatives thereof, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2'-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl) ether, bis(2-diethylaminoethyl) ether, 1-(2-hydroxyethyl)-2-imidazolizinone, 2-quinoxalinol, N,N,N',N'-tetrakis(2-hydroxypropyl)ethylenediamine, N,N,N',N'',N''-pentamethyldiethylenetriamine, triethanolamine, and the like.

Examples of the amide group-containing compounds include N-t-butoxycarbonyl group-containing amino compounds, formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl) isocyanurate, and the like.

Examples of the urea compounds include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compounds include imidazoles, pyridines, piperazines, pyrazine, pyrazole, pyridazine, quinoxaline, purine, pyrrolidine, piperidine, 4-hydroxy-N-amyloxycarbonylpiperidine, piperidineethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like.

A photodegradable base that generates a weak acid upon exposure may be used as the acid diffusion controller (D). The photodegradable base generates an acid in the exposed area, and increases the insolubility of the polymer (A) in the developer, so that roughness of the surface of the exposed area after development is suppressed. The photodegradable base functions as a quencher that captures an acid due to an anion in the unexposed area, and captures an acid diffused from the exposed area. Specifically, since the photodegradable base functions as a quencher only in the unexposed area, the contrast of the deprotection reaction is improved, so that the resolution can be further improved. Examples of the photodegradable base include onium salt compounds that lose acid-diffusion controllability upon decomposition due to exposure. Examples of the onium salt compounds include sulfonium salt compounds shown by the following formula (D1) and iodonium salt compounds shown by the following formula (D2).

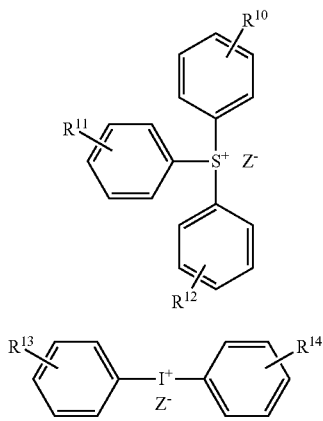

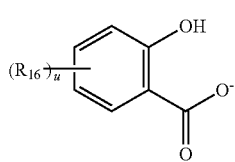

wherein $R^{10}$ to $R^{14}$ individually represent a hydrogen atom, an alkyl group, an alkoxyl group, a hydroxyl group, a halogen atom, or $-SO_2-R^C$, $R^C$ represents an alkyl group, a cycloalkyl group, an alkoxy group, or an aryl group, $Z^-$ represents $OH^-$, $R^{15}-COO^-$, $R^D-SO_2-N^--R^{15}$, $R^{15}-SO_3^-$, or an anion shown by the following formula (D3), $R^{15}$ represents a linear or branched alkyl group having 1 to 10 carbon atoms, a cycloalkyl group having 3 to 20 carbon atoms, an aryl group having 6 to 30 carbon atoms, or an alkaryl group having 7 to 30 carbon atoms, provided that some or all of the hydrogen atoms of the alkyl group, the cycloalkyl group, the aryl group, or the alkaryl group may be substituted with a substituent, and $R^D$ represents a linear or branched alkyl group having 1 to 10 carbon atoms or a substituted or unsubstituted cycloalkyl group having 3 to 20 carbon atoms, provided that some or all of the hydrogen atoms of the alkyl group or the cycloalkyl group may be substituted with a fluorine atom, and a fluorine atom is not bonded to the carbon atom bonded to $SO_3^-$ when $Z^-$ represents $R^{15}-SO_3^-$.

wherein $R^{16}$ represents a linear or branched alkyl group having 1 to 12 carbon atoms wherein some or all of the hydrogen atoms may be substituted with a fluorine atom, or a linear or branched alkoxy group having 1 to 12 carbon atoms, and u is an integer from 0 to 2.

$R^{10}$ to $R^{14}$ in the formulas (D1) and (D2) preferably represent a hydrogen atom or $-SO_2-R^C$. $R^C$ preferably represents a cycloalkyl group (more preferably a cyclohexyl group).

Examples of the alkyl group represented by $R^{15}$ include a methyl group, an ethyl group, a propyl group, an i-propyl group, a butyl group, an i-butyl group, a t-butyl group, groups obtained by substituting some or all of the hydrogen atoms of these groups with a substituent, and the like.

Examples of the cycloalkyl group represented by $R^{15}$ include a cyclopentyl group, a cyclohexyl group, a norbornyl group, a tricyclodecanyl group, a tetracyclododecanyl group, an adamantyl group, groups obtained by substituting some or all of the hydrogen atoms of these groups with a substituent, and the like.

Examples of the aryl group represented by $R^{15}$ include a phenyl group, a naphthyl group, an anthranyl group, groups obtained by substituting some or all of the hydrogen atoms of these groups with a substituent, and the like.

Examples of the alkaryl group represented by $R^{15}$ include a benzyl group, a phenyl ethyl group, a phenylpropyl group, groups obtained by substituting some or all of the hydrogen atoms of these groups with a substituent, and the like.

Examples of a substituent for the alkyl group, the cycloalkyl group, the aryl group, and the alkaryl group include a hydroxyl group, a halogen atom, an alkoxy group, a lactone group, an alkylcarbonyl group, and the like.

Examples of the alkyl group represented by $R^D$ include a methyl group, an ethyl group, a propyl group, a butyl group, and the like.

Examples of the cycloalkyl group represented by $R^D$ include a cyclopentyl group, a cyclohexyl group, a norbornyl group, an adamantyl group, and the like.

Examples of the photodegradable base include the compounds shown by the following formulas, and the like.

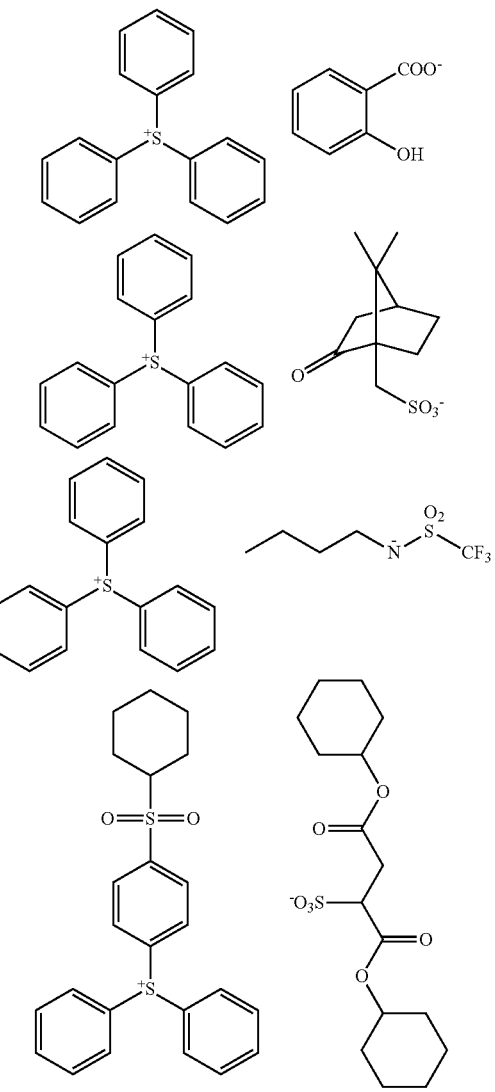

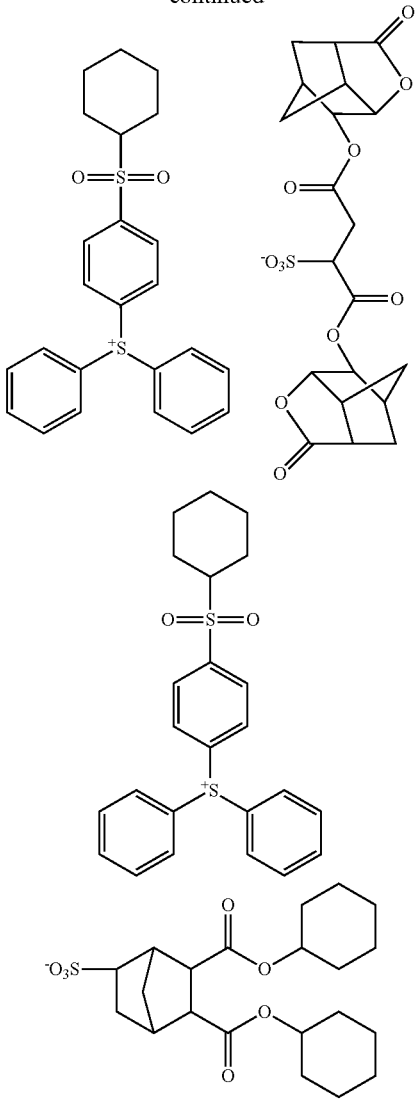

The content of the acid diffusion controller (D) in the photoresist composition used for the pattern-forming method is preferably less than 10 parts by mass based on 100 parts by mass of the polymer (A). If the content of the acid diffusion controller (D) exceeds 10 parts by mass, the sensitivity of the resulting resist may decrease. These acid diffusion controllers (D) may be used either individually or in combination.

<Solvent (E)>

The photoresist composition used for the pattern-forming method normally includes the solvent (E). The solvent (E) is not particularly limited as long as the solvent can dissolve the polymer (A), the acid generator (B), the acid diffusion controller (D), and an optional component. Examples of the solvent (E) include alcohol solvents, ether solvents, ketone solvents, amide solvents, ester solvents, a mixture thereof, and the like.

Specific examples of the solvent (E) include the organic solvents mentioned above in connection with the step (3) of the resist pattern-forming method. Among these, propylene glycol monomethyl ether acetate, cyclohexanone, and γ-butyrolactone are preferable. These solvents may be used either individually or in combination.

<Optional Component>

The photoresist composition used for the pattern-forming method may optionally include a surfactant, an alicyclic skeleton-containing compound, a sensitizer, and the like. Note that the photoresist composition may include only one type of each optional component, or may include two or more types of each optional component.

[Surfactant]

The surfactant improves the applicability, striation, developability, and the like of the photoresist composition used for the pattern-forming method. Examples of the surfactant include nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate; commercially available products such as KP341 (manufactured by Shin-Etsu Chemical Co., Ltd.), Polyflow No. 75, Polyflow No. 95 (manufactured by Kyoeisha Chemical Co., Ltd.), EFTOP EF301, EFTOP EF303, EFTOP EF352 (manufactured by JEMCO, Inc.), Megafac F171, Megafac F173 (manufactured by DIC Corporation), Fluorad FC430, Fluorad FC431 (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.); and the like.

[Alicyclic Skeleton-Containing Compound]

The alicyclic skeleton-containing compound improves the dry etching resistance, the pattern shape, adhesion to a substrate, and the like of the photoresist composition used for the pattern-forming method.

Examples of the alicyclic skeleton-containing compound include adamantane derivatives such as 1-adamantanecarboxylic acid, 2-adamantanone, and t-butyl 1-adamantanecarboxylate; deoxycholates such as t-butyl deoxycholate, t-butoxycarbonylmethyl deoxycholate, and 2-ethoxyethyl deoxycholate; lithocholates such as t-butyl lithocholate, t-butoxycarbonylmethyl lithocholate, and 2-ethoxyethyl lithocholate; 3-[2-hydroxy-2,2-bis(trifluoromethyl)ethyl]tetracyclo[4.4.0.1$^{2,5}$.1$^{7,10}$]dodecane, 2-hydroxy-9-methoxycarbonyl-5-oxo-4-oxa-tricyclo[4.2.1.0$^{3,7}$]nonane, and the like. These alicyclic skeleton-containing compounds may be used either individually or in combination.

[Sensitizer]

The sensitizer increases the amount of acid generated by the acid generator (B), and improves the apparent sensitivity of the photoresist composition used for the pattern-forming method.

Examples of the sensitizer include carbazoles, acetophenones, benzophenones, naphthalenes, phenols, biacetyl, eosine, rose bengal, pyrenes, anthracenes, phenothiazines, and the like. These sensitizers may be used either individually or in combination.

<Production of Photoresist Composition>

The photoresist composition used for the pattern-forming method may be produced by mixing the polymer (A), the acid generator (B), the polymer (C), the acid diffusion controller (D), and the optional components in the solvent (E) in a given ratio, for example. The composition is used in a state in which the components are dissolved or dispersed in an appropriate solvent (E).

<Developer>

The developer is a negative developer that may suitably be used for the pattern-forming method, and includes an organic solvent and a nitrogen-containing compound. The description given above in connection with the developer used in the step (3) of the pattern-forming method may be applied to the developer.

The invention is further described below by way of examples. Note that the invention is not limited to the following examples. The property values were measured by the following methods.

[Weight Average Molecular Weight (Mw) and Number Average Molecular Weight (Mn)]

The weight average molecular weight (Mw) and the number average molecular weight (Mn) of the polymer were measured by gel permeation chromatography (GPC) using GPC columns manufactured by Tosoh Corporation (G2000HXL×2, G3000HXL×1, G4000HXL×1) under the following conditions.
Eluant: tetrahydrofuran (manufactured by Wako Pure Chemical Industries, Ltd.)
Flow rate: 1.0 ml/min
Sample concentration: 1.0 mass %
Amount of sample introduced: 100 μl
Detector: differential refractometer
Standard: monodisperse polystyrene

[Content of Low-Molecular-Weight Components]

The content (mass %) of low-molecular-weight components (components having a molecular weight of less than 1000) in the polymer was determined by high-performance liquid chromatography (HPLC) using an Intersil ODS-25 micrometer column (4.6 mm (diameter)×250 mm) (manufactured by GL Sciences Inc.) under the following conditions.
Eluant: acrylonitrile/0.1% phosphoric acid aqueous solution
Flow rate: 1.0 ml/min
Sample concentration: 1.0 mass %
Amount of sample introduced: 100 μl
Detector: differential refractometer

[$^{13}$C-NMR Analysis]

The polymer was subjected to $^{13}$C-NMR analysis using a spectrometer "JNM-EX400" (manufactured by JEOL Ltd.) (solvent: DMSO-d$_6$). The content of each structural unit in the polymer was calculated from the area ratio of the peak corresponding to each structural unit in a spectrum obtained by $^{13}$C-NMR.

<Synthesis of Polymer (a)>

The following monomers were used to synthesize the polymers (A) and (C).

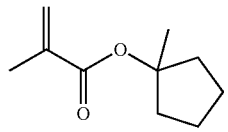

(M-1)

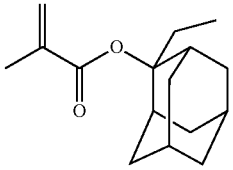

(M-2)

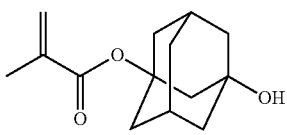

(M-3)

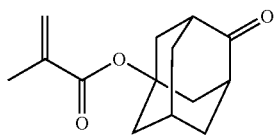

(M-4)

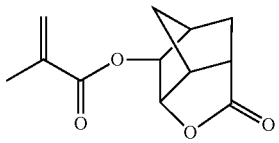

(M-5)

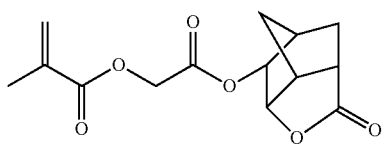

(M-6)

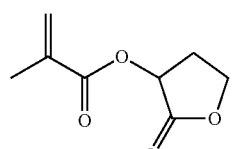

(M-7)

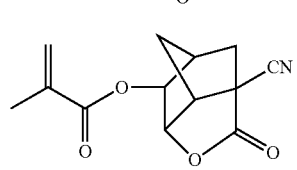

(M-8)

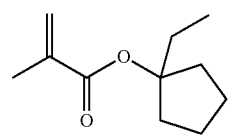

(M-9)

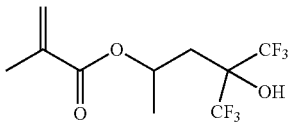

(M-10)

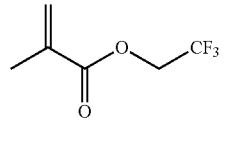

(M-11)

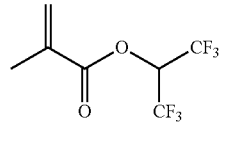

(M-12)

Synthesis Example 1

43.08 g (50 mol %) of the compound (M-1) and 56.92 g (50 mol %) of the compound (M-5) were dissolved in 200 g of 2-butanone. 4.21 g (5 mol % based on the total amount of the monomer compounds) of AIBN was added to the solution to prepare a monomer solution. A three-necked flask (1000 ml) charged with 100 g of 2-butanone was purged with nitrogen for 30 minutes, and heated to 80° C. with stirring. The monomer solution was added dropwise to the flask using a dropping funnel over 3 hours. The monomers were polymerized for 6 hours from the start of addition of the monomer solution. After completion of polymerization, the polymer solution was cooled with water to 30° C. or less. The cooled polymer solution was added to 2000 g of methanol, and a precipitated white powder was collected by filtration. The white powder thus collected was washed twice with 400 g of methanol, collected again by filtration, and dried at 50° C. for 17 hours to obtain a white powdery polymer (A-1) (73 g, yield: 73%). The polymer (A-1) had an Mw of 7730, an Mw/Mn ratio of 1.51, and a content of low-molecular-weight components of 0.05 mass %. The ratio of structural units (I) derived from the compound (M-1) to structural units (II) derived from the compound (M-5) in the polymer (A-1) determined by $^{13}$C-NMR analysis was 47.3:52.7 (mol %).

Synthesis Examples 2 to 4

Polymers (A-2) to (A-4) were produced in the same manner as in Synthesis Example 1, except for using the monomers shown in Table 1. The content of each structural unit, the Mw, the Mw/Mn ratio, the yield, and the content of low-molecular-weight components of (in) each polymer are also shown in Table 1.

stirred, and allowed to stand for 30 minutes. The lower layer was collected, and dissolved in propylene glycol monomethyl ether acetate (yield: 60%). The resulting polymer (C-1) had an Mw of 7200, an Mw/Mn ratio of 2.00, and a content of low-molecular-weight components of 0.07 mass %. The ratio of structural units derived from the compound (M-9) to structural units derived from the compound (M-11) in the polymer (C-1) determined by $^{13}$C-NMR analysis was 71.1:28.9 (mol %).

Synthesis Example 6

A polymer (C-2) was produced in the same manner as in Synthesis Example 5, except for using the monomers shown in Table 1. The content of structural units derived from each monomer compound, the Mw, the Mw/Mn ratio, the yield, and the content of low-molecular-weight components of (in) each polymer are also shown in Table 1.

TABLE 1

| Polymer | | Monomer | | Yield (%) | Content (mol %) of each structural unit | Mw | Mw/Mn | Content (mass %) of low-molecular- weight components |
|---|---|---|---|---|---|---|---|---|
| | (A) or (C) | Type | Amount (mol %) | | | | | |
| Synthesis Example 1 | A-1 | M-1/M-5 | 50/50 | 73 | 47.3/52.7 | 7730 | 1.51 | 0.05 |
| Synthesis Example 2 | A-2 | M-2/M-3/M-6 | 50/10/40 | 65 | 47.2/10.8/42 | 7410 | 1.62 | 0.06 |
| Synthesis Example 3 | A-3 | M-1/M-4/M-7 | 50/10/40 | 76 | 49.8/10.2/40 | 7610 | 1.55 | 0.05 |
| Synthesis Example 4 | A-4 | M-1/M-2/M-8 | 45/15/40 | 70 | 45.2/14.6/40.2 | 7530 | 1.52 | 0.05 |
| Synthesis Example 5 | C-1 | M-9/M-11 | 70/30 | 60 | 71.1/28.9 | 7200 | 2.00 | 0.07 |
| Synthesis Example 6 | C-2 | M-10/M-12 | 30/70 | 62 | 29.8/70.2 | 7080 | 1.89 | 0.07 |

Synthesis of Fluorine-Containing Polymer (C)

Synthesis Example 5

71.67 g (70 mol %) of the compound (M-9) and 28.33 g (30 mol %) of the compound (M-11) were dissolved in 100 g of 2-butanone. 10.35 g of dimethyl-2,2'-azobisisobutyrate was added to the solution to prepare a monomer solution. A three-necked flask (1000 ml) charged with 100 g of 2-butanone was purged with nitrogen for 30 minutes, and heated to 80° C. with stirring. The monomer solution was added dropwise to the flask using a dropping funnel over 3 hours. The monomers were polymerized for 6 hours from the start of addition of the monomer solution. After completion of polymerization, the polymer solution was cooled with water to 30° C. or less. The polymer solution was put in a 4l separating funnel, and homogeneously diluted with 300 g of n-hexane. After the addition of 1200 g of methanol, the components were mixed. After the addition of 60 g of distilled water, the mixture was <Production of Developer>

The following nitrogen-containing compounds were used to produce each developer.
(Nitrogen-Containing Compound)
(F-1): tri-n-octylamine
(F-2): di-n-octylamine
(F-3): 1-aminodecane
(F-4): N,N-dibutylaniline
(F-5): proline
(F-6): tetramethylethylenediamine Example 1

0.1 g (0.1 mass %) of the nitrogen-containing compound (F-1) was added to 99.9 g (99.9 mass %) of methyl n-amyl ketone. The mixture was stirred to obtain a developer (G-1).

Examples 2 to 14 and Comparative Example 1

Developers (G-2) to (G-14) and (g-1) were obtained in the same manner as in Example 1, except for using the organic solvent and the nitrogen-containing compound shown in Table 2.

TABLE 2

| | Developer | Organic solvent Type | Amount (mass %) | Nitrogen-containing compound Type | Amount (mass %) |
|---|---|---|---|---|---|
| Example 1 | G-1 | Methyl n-amyl ketone | 99.9 | F-1 | 0.1 |
| Example 2 | G-2 | Methyl n-amyl ketone | 99.0 | F-1 | 1.0 |
| Example 3 | G-3 | Methyl n-amyl ketone | 90.0 | F-2 | 10.0 |
| Example 4 | G-4 | Methyl n-amyl ketone | 98.0 | F-3 | 2.0 |
| Example 5 | G-5 | Methyl n-amyl ketone | 98.0 | F-4 | 2.0 |
| Example 6 | G-6 | Methyl n-amyl ketone | 98.0 | F-5 | 2.0 |
| Example 7 | G-7 | Methyl n-amyl ketone | 98.0 | F-1 | 2.0 |
| Example 8 | G-8 | n-Butyl acetate | 98.0 | F-4 | 2.0 |
| Example 9 | G-9 | n-Butyl acetate | 98.0 | F-5 | 2.0 |
| Example 10 | G-10 | n-Butyl acetate | 98.0 | F-2 | 2.0 |
| Example 11 | G-11 | Anisole | 98.0 | F-3 | 2.0 |
| Example 12 | G-12 | Anisole | 98.0 | F-5 | 2.0 |
| Example 13 | G-13 | Anisole | 98.0 | F-4 | 2.0 |
| Example 14 | G-14 | Methyl n-amyl ketone | 97.5 | F-6 | 2.5 |
| Comparative Example 1 | g-1 | Methyl n-amyl ketone | 100.0 | — | — |

<Production of Photoresist Composition>

The following acid generator (B), acid diffusion controller (D), and solvent (E) were used to produce the photoresist composition.

(Acid Generator (B))
Compounds shown by the following formulas (B-1) and (B-2)

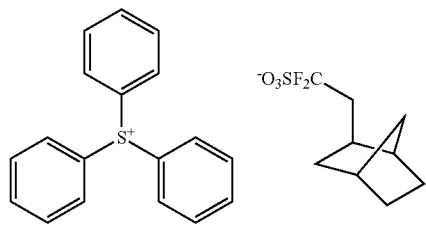
(B-1)

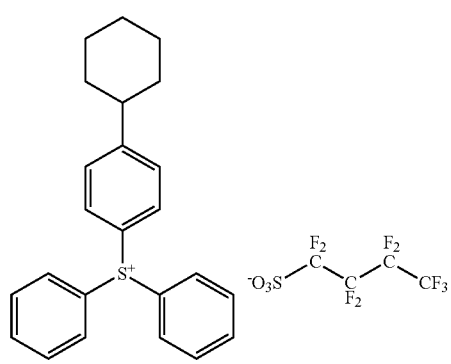
(B-2)

(Acid Diffusion Controller (D))
Compounds shown by the following formulas (D-1) to (D-3)
(D-1): triphenylsulfonium camphorsulfonate
(D-2): 4-hydroxy-N-amyloxycarbonylpiperidine
(D-3): triethanolamine

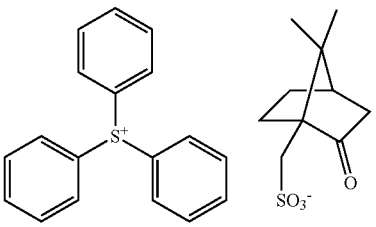
(D-1)

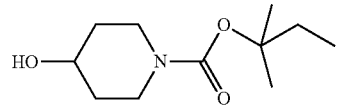
(D-2)

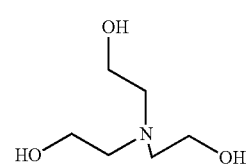
(D-3)

(Solvent (E))
(E-1): propylene glycol monomethyl ether acetate
(E-2): cyclohexanone
(E-3): γ-butyrolactone Synthesis Example 7

100 parts by mass of the polymer (A-1), 7.2 parts by mass of the acid generator (B-2), 3 parts by mass of the polymer (C-1), 3.9 parts by mass of the acid diffusion controller (D-1), 2110 parts by mass of the solvent (E-1), 900 parts by mass of the solvent (E-2), and 30 parts by mass of the solvent (E-3) were mixed. The mixture was filtered through a filter having a pore size of 0.20 μm to obtain a photoresist composition (J-1).

Synthesis Examples 8 to 10

Photoresist compositions (J-2) to (J-4) were produced in the same manner as in Synthesis Example 7, except for using the components shown in Table 3.

TABLE 3

| | Photoresist composition | Polymer (A) | | Acid generator (B) | | Polymer (C) | | Acid diffusion controller (D) | | Solvent (E) | |
|---|---|---|---|---|---|---|---|---|---|---|---|
| | | Type | Amount (parts by mass) | Type | Amount (parts by mass) | Type | Amount (parts by mass) | Type | Amount (parts by mass) | Type | Parts by mass |
| Synthesis Example 7 | J-1 | A-1 | 100 | B-2 | 7.2 | C-1 | 3 | D-1 | 3.9 | E-1 E-2 E-3 | 2,110 900 30 |
| Synthesis Example 8 | J-2 | A-2 | 100 | B-1 | 7.8 | C-2 | 3 | D-2 | 1.0 | E-1 E-2 E-3 | 2,110 900 30 |
| Synthesis Example 9 | J-3 | A-3 | 100 | B-1 | 7.8 | C-1 | 3 | D-3 | 1.0 | E-1 E-2 E-3 | 2,150 940 30 |
| Synthesis Example 10 | J-4 | A-4 | 100 | B-2 | 7.2 | C-2 | 3 | D-2 | 1.0 | E-1 E-2 E-3 | 2,150 940 30 |

<Formation of Resist Pattern>

Examples 15 to 31 and Comparative Examples 2 to 5

A lower-layer antireflective film composition ("ARC66" manufactured by Brewer Science) was spin-coated onto a 12-inch silicon wafer using a spin coater ("CLEAN TRACK Lithius Pro i" manufactured by Tokyo Electron Ltd.), and baked at 205° C. for 60 seconds to form a lower-layer antireflective film (thickness: 105 nm). The photoresist composition (see Table 4) was applied to the lower-layer antireflective film using the above spin coater, and prebaked (PB) at 90° C. for 60 seconds. The composition was then cooled at 23° C. for 30 seconds to form a resist film having a thickness of 90 nm. The resist film was exposed under best focus conditions using an ArF immersion scanner ("NSR-S610C" manufactured by Nikon Precision Inc.) (NA: 1.3, Dipole). The resist film was subjected to ¼ projection exposure. The size on the reticle was 160 nm chromium/320 nm pitch, and the mask bias was 0 nm. The resist film was subjected to PEB at the temperature shown in Table 4 for 60 seconds on a hot plate ("CLEAN TRACK Lithius Pro i"), cooled at 23° C. for 30 seconds, subjected to puddle development for 30 seconds using the developer shown in Table 4, and rinsed with 4-methyl-2-pentanol for 7 seconds. The wafer was spin-dried at 2000 rpm for 15 seconds to form a resist pattern (40 nm line/80 nm pitch). The measurement was performed using a scanning electron microscope ("CG4000" manufactured by Hitachi High-Technologies Corporation).

<Evaluation>

The properties of the resist pattern were evaluated as described below.

The results are shown in Table 4.

[Sensitivity]

An optimum dose at which a 40 nm line/80 nm pitch pattern was formed by the above pattern-forming method was taken as the sensitivity (mJ/cm$^2$). A case where the sensitivity was 60 mJ/cm$^2$ or less was evaluated as "Acceptable".

[Exposure Latitude (EL)]

The resist film was exposed via a mask designed so that a 40 nm line/80 nm pitch line pattern was formed by reduced projection exposure. The ratio of the dose range in which the line width was within ±10% of 40 nm to the optimum dose was taken as the exposure latitude (EL) (%).

A case where the EL was 10% or more was evaluated as "Acceptable" (i.e., a change in patterning capability due to a change in dose was determined to be small).

[Depth of Focus (DOF)]

The resist film was exposed via a mask designed so that a 40 nm line/80 nm pitch pattern was formed by reduced projection exposure. A change in focus when the line width of the line pattern was within ±10% of 40 nm was taken as the depth of focus (DOF) (nm). A case where the DOF was 300 nm or more was evaluated as "Acceptable" (i.e., a change in patterning capability with respect to a change in focus was determined to be small).

[Line Width Roughness (LWR) (Nm))]

A 40 nm line/80 nm pitch pattern resolved at the optimum dose was observed from above using a scanning electron microscope ("CG4000" manufactured by Hitachi High-Technologies Corporation). The line width was measured at an arbitrary 50 points, and a variation in measured values was indicated by 3σ (i.e., LWR) (nm). A case where the LWR was 4.5 nm or less was evaluated as "Acceptable".

[Film Loss]

A resist film (initial thickness: 120 nm) was formed using the photoresist composition an 8-inch silicon wafer on which a lower-layer antireflective film ("ARC29A" manufactured by Bruwer Science) (thickness: 77 nm) was formed, and prebaked (PB) at 90° C. for 60 seconds. The entire resist film was exposed at the optimum dose (Eop) (i.e., a dose at which a 40 nm line/80 nm pitch pattern was formed) using an ArF excimer laser exposure system ("NSR S306C" manufactured by Nikon Corp., NA=0.78, σ=0.90, Conventional). After completion of exposure, the resist film was subjected to PEB at the temperature shown in Table 4 for 60 seconds. The resist film was developed at 23° C. for 30 seconds using the developer shown in Table 4, rinsed with 4-methyl-2-pentanol for 7 seconds, and dried. The thickness of the remaining resist film was then measured. A value obtained by subtracting the thickness of the remaining resist film from the initial thickness was taken as the film loss (nm). Note that the thickness of the film was measured using a spectroscopic film thickness measurement system ("Lambda Ace" manufactured by Dainippon Screen Mfg. Co., Ltd.). A case where the film loss was less than 30 nm was evaluated as "Acceptable", and a case where the film loss was 30 nm or more was evaluated as "Unacceptable".

TABLE 4

|  | Photoresist composition | PEB Temp. (°C.) | Time (s) | Developer | Sensitivity (mJ/cm²) | Film loss (nm) | LWR (nm) | EL (%) | DOF (nm) |
|---|---|---|---|---|---|---|---|---|---|
| Example 15 | J-1 | 105 | 60 | G-1 | 54.0 | 25.6 | 4.30 | 16.5 | 330 |
| Example 16 | J-1 | 105 | 60 | G-2 | 48.0 | 23.0 | 4.23 | 15.4 | 300 |
| Example 17 | J-1 | 105 | 60 | G-3 | 41.0 | 24.0 | 4.18 | 13.2 | 300 |
| Example 18 | J-1 | 105 | 60 | G-4 | 50.0 | 29.4 | 4.20 | 15.8 | 300 |
| Example 19 | J-1 | 105 | 60 | G-5 | 51.0 | 29.6 | 4.15 | 16.0 | 300 |
| Example 20 | J-1 | 105 | 60 | G-6 | 50.0 | 23.8 | 4.19 | 15.5 | 300 |
| Example 21 | J-1 | 105 | 60 | G-7 | 50.0 | 23.4 | 4.21 | 15.3 | 300 |
| Example 22 | J-1 | 105 | 60 | G-8 | 30.0 | 19.2 | 4.13 | 13.8 | 360 |
| Example 23 | J-1 | 105 | 60 | G-9 | 29.0 | 19.9 | 4.19 | 13.6 | 360 |
| Example 24 | J-1 | 105 | 60 | G-10 | 31.0 | 18.2 | 4.21 | 14.1 | 360 |
| Example 25 | J-1 | 105 | 60 | G-11 | 39.0 | 21.2 | 4.22 | 16.2 | 330 |
| Example 26 | J-1 | 105 | 60 | G-12 | 39.0 | 20.9 | 4.26 | 16.5 | 330 |
| Example 27 | J-1 | 105 | 60 | G-13 | 40.0 | 20.8 | 4.23 | 15.9 | 330 |
| Example 28 | J-2 | 95 | 60 | G-2 | 40.0 | 29.5 | 4.36 | 19.2 | 360 |
| Example 29 | J-3 | 105 | 60 | G-2 | 29.0 | 27.8 | 4.41 | 21.2 | 360 |
| Example 30 | J-4 | 95 | 60 | G-2 | 37.0 | 26.4 | 4.10 | 25.3 | 390 |
| Example 31 | J-1 | 90 | 60 | G-14 | 46.0 | 21.7 | 4.11 | 14.5 | 300 |
| Comparative Example 2 | J-1 | 105 | 60 | g-1 | 58.0 | 43.0 | 4.80 | 20.2 | 330 |
| Comparative Example 3 | J-2 | 95 | 60 | g-1 | 44.0 | 54.2 | 5.56 | 21.2 | 330 |
| Comparative Example 4 | J-3 | 105 | 60 | g-1 | 46.0 | 46.4 | 5.75 | 23.5 | 330 |
| Comparative Example 5 | J-4 | 95 | 60 | g-1 | 45.0 | 42.6 | 5.32 | 27.2 | 330 |

As shown in Table 4, the resist pattern-forming method according to the embodiments of the invention can significantly suppress a film loss when forming a resist pattern, and can reduce a variation in the line width of the resulting pattern. It is also possible to form a resist pattern that exhibits sufficient sensitivity, EL, and DOF.

The resist pattern-forming method according to the embodiments of the invention can suppress a film loss when forming a resist pattern, and can form a resist pattern that exhibits reduced LWR and sufficient EL, DOF, and the like. Therefore, the pattern-forming method may suitably be used to form a resist pattern in lithography employed when producing various electronic devices (e.g., semiconductor devices and liquid crystal devices).

The resist pattern-forming method according to the embodiments of the invention can suppress a film loss when forming a resist pattern, and can form a resist pattern that exhibits reduced LWR and sufficient EL, DOF, and the like.

Obviously, numerous modifications and variations of the invention are possible in light of the above teachings. It is therefore to be understood that within the scope of the appended claims, the invention may be practiced otherwise than as specifically described herein.

What is claimed is:

1. A developer comprising:
an organic solvent comprising an ester compound; and
a nitrogen-containing compound,
the developer being configured to develop a resist film to form a negative resist pattern, the resist film being formed using a photoresist composition comprising:
a polymer that includes a structural unit including an acid-labile group and produced by polymerizing a monomer having an ethylenically unsaturated bond; and
a radiation-sensitive acid generator.

2. The developer according to claim 1, wherein the nitrogen-containing compound is a compound shown by a formula (1),

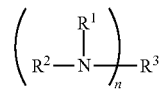

wherein $R^1$ and $R^2$ individually represent a hydrogen atom, a hydroxyl group, a formyl group, an alkoxy group, an alkoxycarbonyl group, a chain-like hydrocarbon group having 1 to 30 carbon atoms, an alicyclic hydrocarbon group having 3 to 30 carbon atoms, an aromatic hydrocarbon group having 6 to 14 carbon atoms, or a group formed by two or more of these groups, $R^3$ represents a hydrogen atom, a hydroxyl group, a formyl group, an alkoxy group, an alkoxycarbonyl group, an n-valent chain-like hydrocarbon group having 1 to 30 carbon atoms, an n-valent alicyclic hydrocarbon group having 3 to 30 carbon atoms, an n-valent aromatic hydrocarbon group having 6 to 14 carbon atoms, or an n-valent group formed by two or more of these groups, n is an integer equal to or larger than 1, provided that a plurality of $R^1$ and a plurality of $R^2$ may be either a same or different when n is 2 or more, and two of $R^1$ to $R^3$ optionally bond to form a cyclic structure together with the nitrogen atom bonded thereto.

3. The developer according to claim 2, wherein the compound shown by the formula (1) is at least one compound selected by the group consisting of a mono(cyclo)alkylamine having one nitrogen atom, a di(cyclo)alkylamine having one nitrogen atom, a tri(cyclo)alkylamine having one nitrogen atom, a substituted alkylamine having one nitrogen atom, an aromatic amine having one nitrogen atom, a (cyclo)alkylamine compound having two nitrogen atoms, a (cyclo)alkylamine compound having three nitrogen atoms, a nitrogen-containing aromatic heterocyclic compound, a nitrogen-containing aliphatic heterocyclic compound, an amid group-containing compound, and a urea compound.

4. A developer comprising:
an organic solvent comprising an ether compound; and
a nitrogen-containing compound, the developer being configured to develop a resist film to form a negative resist pattern, the resist film being formed using a photoresist composition comprising:
a polymer that includes a structural unit including an acid-labile group and produced by polymerizing a monomer having an ethylenically unsaturated bond; and
a radiation-sensitive acid generator.

5. The developer according to claim 4, wherein the nitrogen-containing compound is a compound shown by a formula (1),

(1)

wherein $R^1$ and $R^2$ individually represent a hydrogen atom, a hydroxyl group, a formyl group, an alkoxy group, an alkoxycarbonyl group, a chain-like hydrocarbon group having 1 to 30 carbon atoms, an alicyclic hydrocarbon group having 3 to 30 carbon atoms, an aromatic hydrocarbon group having 6 to 14 carbon atoms, or a group formed by two or more of these groups, $R^3$ represents a hydrogen atom, a hydroxyl group, a formyl group, an alkoxy group, an alkoxycarbonyl group, an n-valent chain-like hydrocarbon group having 1 to 30 carbon atoms, an n-valent alicyclic hydrocarbon group having 3 to 30 carbon atoms, an n-valent aromatic hydrocarbon group having 6 to 14 carbon atoms, or an n-valent group formed by two or more of these groups, n is an integer equal to or larger than 1, provided that a plurality of $R^1$ and a plurality of $R^2$ may be either a same or different when n is 2 or more, and two of $R^1$ to $R^3$ optionally bond to form a cyclic structure together with the nitrogen atom bonded thereto.

6. The developer according to claim 5, wherein the compound shown by the formula (1) is at least one compound selected by the group consisting of a mono(cyclo)alkylamine having one nitrogen atom, a di(cyclo)alkylamine having one nitrogen atom, a tri(cyclo)alkylamine having one nitrogen atom, a substituted alkylamine having one nitrogen atom, an aromatic amine having one nitrogen atom, a (cyclo)alkylamine compound having two nitrogen atoms, a (cyclo)alkylamine compound having three nitrogen atoms, a nitrogen-containing aromatic heterocyclic compound, a nitrogen-containing aliphatic heterocyclic compound, an amid group-containing compound, and a urea compound.

7. A developer comprising:
an organic solvent comprising methyl n-amyl ketone; and
a nitrogen-containing compound,
the developer being configured to develop a resist film to form a negative resist pattern, the resist film being formed using a photoresist composition comprising:
a polymer that includes a structural unit including an acid-labile group and produced by polymerizing a monomer having an ethylenically unsaturated bond; and
a radiation-sensitive acid generator.

8. The developer according to claim 7, wherein the nitrogen-containing compound is a compound shown by a formula (1),

(1)

wherein $R^1$ and $R^2$ individually represent a hydrogen atom, a hydroxyl group, a formyl group, an alkoxy group, an alkoxycarbonyl group, a chain-like hydrocarbon group having 1 to 30 carbon atoms, an alicyclic hydrocarbon group having 3 to 30 carbon atoms, an aromatic hydrocarbon group having 6 to 14 carbon atoms, or a group formed by two or more of these groups, $R^3$ represents a hydrogen atom, a hydroxyl group, a formyl group, an alkoxy group, an alkoxycarbonyl group, an n-valent chain-like hydrocarbon group having 1 to 30 carbon atoms, an n-valent alicyclic hydrocarbon group having 3 to 30 carbon atoms, an n-valent aromatic hydrocarbon group having 6 to 14 carbon atoms, or an n-valent group formed by two or more of these groups, n is an integer equal to or larger than 1, provided that a plurality of $R^1$ and a plurality of $R^2$ may be either a same or different when n is 2 or more, and two of $R^1$ to $R^3$ optionally bond to form a cyclic structure together with the nitrogen atom bonded thereto.

9. The developer according to claim 8, wherein the compound shown by the formula (1) is at least one compound selected by the group consisting of a mono(cyclo)alkylamine having one nitrogen atom, a di(cyclo)alkylamine having one nitrogen atom, a tri(cyclo)alkylamine having one nitrogen atom, a substituted alkylamine having one nitrogen atom, an aromatic amine having one nitrogen atom, a (cyclo)alkylamine compound having two nitrogen atoms, a (cyclo)alkylamine compound having three nitrogen atoms, a nitrogen-containing aromatic heterocyclic compound, a nitrogen-containing aliphatic heterocyclic compound, an amid group-containing compound, and a urea compound.

\* \* \* \* \*